(12) United States Patent
Toya et al.

(10) Patent No.: US 10,651,666 B2
(45) Date of Patent: May 12, 2020

(54) ELECTRICITY-STORAGE SYSTEM, MONITORING DEVICE, AND POWER CONTROL SYSTEM

(71) Applicant: Panasonic Intellectual Property Management Co., Ltd., Osaka (JP)

(72) Inventors: Shoichi Toya, Hyogo (JP); Satoru Inakagata, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/883,539

(22) Filed: Jan. 30, 2018

(65) Prior Publication Data

US 2018/0159349 A1 Jun. 7, 2018

Related U.S. Application Data

(63) Continuation of application No. 14/761,150, filed as application No. PCT/JP2014/001599 on Mar. 19, 2014, now Pat. No. 9,923,398.

(30) Foreign Application Priority Data

Mar. 22, 2013 (JP) ................................. 2013-060487

(51) Int. Cl.
*H02J 7/00* (2006.01)
*H02J 7/35* (2006.01)
(Continued)

(52) U.S. Cl.
CPC ........ *H02J 7/0068* (2013.01); *G01R 19/2513* (2013.01); *H01M 10/44* (2013.01);
(Continued)

(58) Field of Classification Search
USPC .......................................................... 320/128
See application file for complete search history.

(56) References Cited

U.S. PATENT DOCUMENTS 6,424,119 B1 * 7/2002 Nelson .................. H02J 7/0013
320/116
7,802,121 B1 9/2010 Zansky et al.
(Continued)

FOREIGN PATENT DOCUMENTS

CN 102577022 7/2012
EP 2 600 487 6/2013
(Continued)

OTHER PUBLICATIONS

International Search Report (ISR) dated Jun. 10, 2014 in International (PCT) Application No. PCT/JP2014/001599.
(Continued)

*Primary Examiner* — Robert Grant
(74) *Attorney, Agent, or Firm* — Wenderoth, Lind & Ponack, L.L.P.

(57) ABSTRACT

An electricity-storage system 110a is configured to be able to charge and discharge by connecting a plug to an electrical outlet 140a. Power discharged from the electricity-storage system 110a is monitored by a reverse-power monitoring device 100 and discharge from the electricity-storage system 110a is executed according to instruction from the reverse-power monitoring device 100, in order to avoid reverse power flow to an electrical grid 150.

8 Claims, 20 Drawing Sheets

(51) Int. Cl.
*H02J 9/06* (2006.01)
*H01M 10/44* (2006.01)
*H01M 10/48* (2006.01)
*G01R 19/25* (2006.01)

(52) U.S. Cl.
CPC .............. *H01M 10/48* (2013.01); *H02J 7/35* (2013.01); *H02J 9/061* (2013.01); *Y02B 10/72* (2013.01)

(56) References Cited

U.S. PATENT DOCUMENTS

| | | | | |
|---|---|---|---|---|
| 8,575,780 | B2 * | 11/2013 | Moon | H02J 9/062 307/125 |
| 2002/0186020 | A1 | 12/2002 | Kondo et al. | |
| 2009/0315512 | A1 | 12/2009 | Ichikawa et al. | |
| 2009/0322154 | A1 | 12/2009 | Ichikawa et al. | |
| 2010/0313931 | A1 | 12/2010 | Yorteda et al. | |
| 2011/0000726 | A1 | 1/2011 | Tanaka | |
| 2011/0208370 | A1 | 8/2011 | Lee | |
| 2012/0193983 | A1 | 8/2012 | Yukizane et al. | |
| 2012/0206104 | A1 | 8/2012 | Tsuchiya | |
| 2013/0035802 | A1 * | 2/2013 | Khaitan | G06F 1/263 700/297 |
| 2013/0119947 | A1 | 5/2013 | Ishida et al. | |
| 2013/0229057 | A1 | 9/2013 | Taima | |

FOREIGN PATENT DOCUMENTS

| | | |
|---|---|---|
| JP | 05-083750 | 4/1993 |
| JP | 05-252671 | 9/1993 |
| JP | 2001-224133 | 8/2001 |
| JP | 2002-354678 | 12/2002 |
| JP | 2003-143763 | 5/2003 |
| JP | 2005-245136 | 9/2005 |
| JP | 2007-133765 | 5/2007 |
| JP | 2008-35665 | 2/2008 |
| JP | 2008-43040 | 2/2008 |
| JP | 2010-288393 | 12/2010 |
| JP | 2012-055066 | 3/2012 |
| JP | 2012-100402 | 5/2012 |
| JP | 2012-210044 | 10/2012 |
| JP | 2013-31236 | 2/2013 |
| JP | 2013-31339 | 2/2013 |
| WO | 2011/045925 | 4/2011 |
| WO | 2012/014410 | 2/2012 |

OTHER PUBLICATIONS

Office Action dated Jan. 20, 2017 in Chinese Application No. 201480011729.7, with partial English translation.
Fan Xinjun, "Motor Technology and Application", p. 120, Huazhong University of Science and Technology Press, Jul. 31, 2012, with English translation.
Wa Jinsheng et al., "Electrical Engineering Handbook of Township Power Supply Institute", pp. 511-512, Dec. 31, 1999, with English translation.
Cui Rongqiang et al., "Grid Connected Solar Photovoltaic Power Generation System", pp. 100-101, Chemical Industry Press, Jul. 31, 2007, with English translation.
Office Action dated Sep. 28, 2018 in U.S. Appl. No. 15/883,585.
Office Action dated Apr. 10, 2019 in U.S. Appl. No. 15/883,585.
Office Action dated Aug. 7, 2019 in U.S. Appl. No. 15/883,585.
Final Office Action dated Dec. 4, 2019 in U.S. Appl. No. 15/883,585.

\* cited by examiner

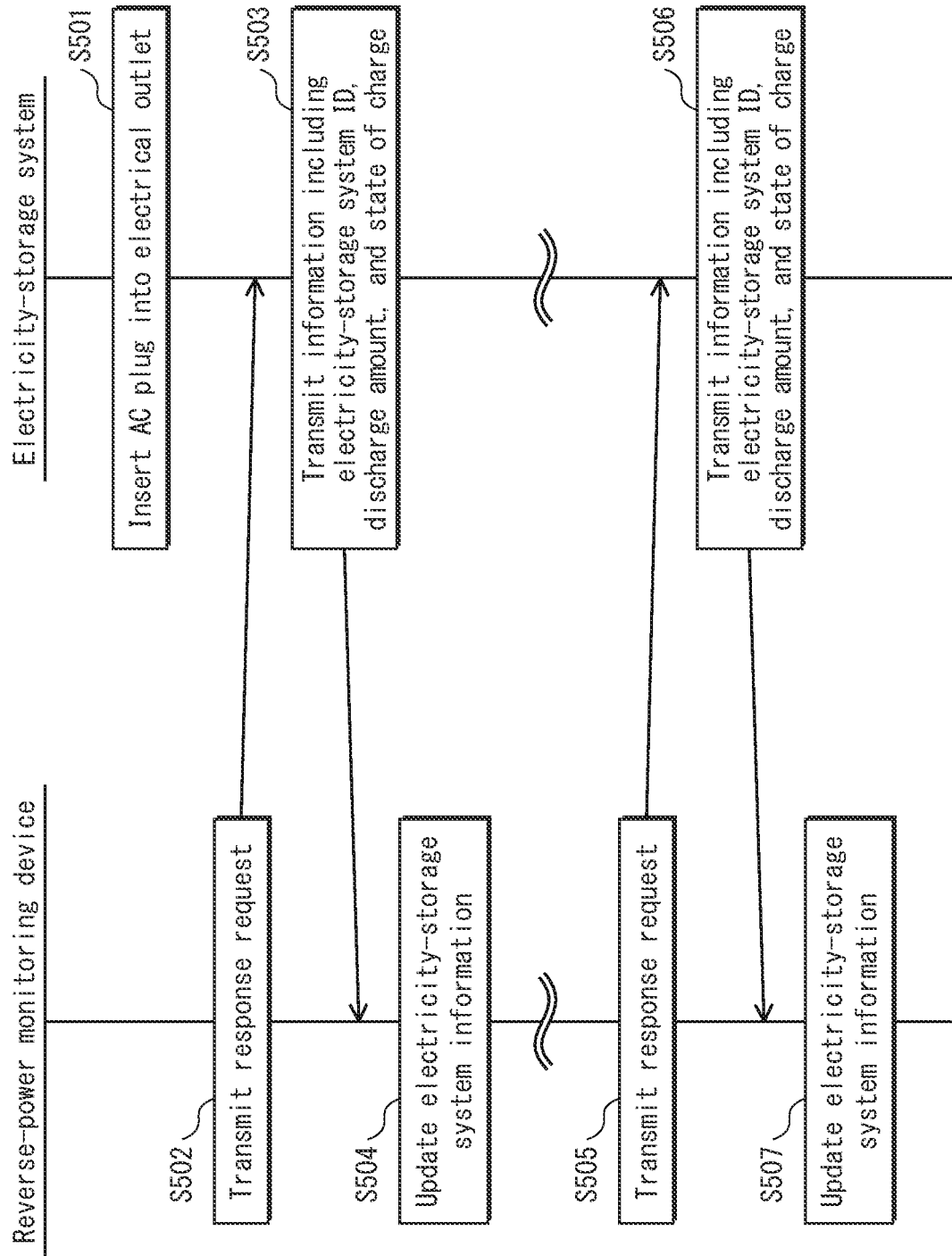

ELECTRICITY-STORAGE SYSTEM, MONITORING DEVICE, AND POWER CONTROL SYSTEM

TECHNICAL FIELD

The present invention relates to electricity-storage systems.

BACKGROUND ART

In recent years, power is being generated from a variety of energy sources such as thermal, hydro, wind, and solar energy sources. However, power shortages do occur for reasons such as resource insufficiency and difficulty in ensuring a stable supply. Thus, apartments, factories, etc., may be provided with batteries to be prepared for emergencies such as power shortage or stoppage.

Patent Literature 1 discloses a power supply system able to supply more power to a load when a power stoppage occurs. Further, Patent Literature 2 discloses a technique of supplying power by connecting a power generator such as a solar cell to an electrical outlet. Further, Patent Literature 3 discloses a reverse-tidal-current-preventing systematically interconnecting system that, in a power supply system, prevents adverse effects to a load from reverse power flow and ensures rapidity of resumed operation of a power system after power stoppage.

CITATION LIST

Patent Literature

[Patent Literature 1] Japanese Patent Application Publication No. 2013-31339
[Patent Literature 2] Japanese Patent Application Publication No. 2002-354678
[Patent Literature 3] Japanese Patent Application Publication No. 2005-245136

SUMMARY OF INVENTION

Technical Problem

By using batteries such as described above, power consumption can be reduced by decreasing reception of public power and electricity costs can be reduced as a result. In the future, it is conceivable that many homes will be provided with a battery. When considering a situation in which typical homes use batteries, high levels of convenience and safety are required for such batteries.

The present invention is achieved in view of the needs described above, and has an aim of providing an electricity-storage system that is easy for users to use and has a high level of safety.

Solution to Problem

To achieve the above aim, the electricity-storage system pertaining to the present invention is an electricity-storage system comprising: a secondary battery; a connector that is connectable to a power line network; a communicator that communicates with an external device; and a controller that controls discharge so that, when a communicator receives an instruction indicating discharge enablement, the power line network is supplied power from the secondary battery via the connector.

Advantageous Effects of Invention

According to the configuration above, the electricity-storage system performs discharging according to instructions from an external device and therefore, when compared to an electricity-storage system that can freely discharge, the possibility of reverse power flow is reduced, increasing safety when using the electricity-storage system. Further, the electricity-storage system can be used simply by connecting a plug to an electrical outlet, and therefore convenience for users is increased.

BRIEF DESCRIPTION OF DRAWINGS

FIG. 3 is a function block diagram showing function configuration of an electricity-storage system 110a.
FIG. 5 is a sequence diagram showing operation of a power control system when a battery is connected to a power line network.

EMBODIMENTS

Embodiment 1

<Configuration>

Figure 1:
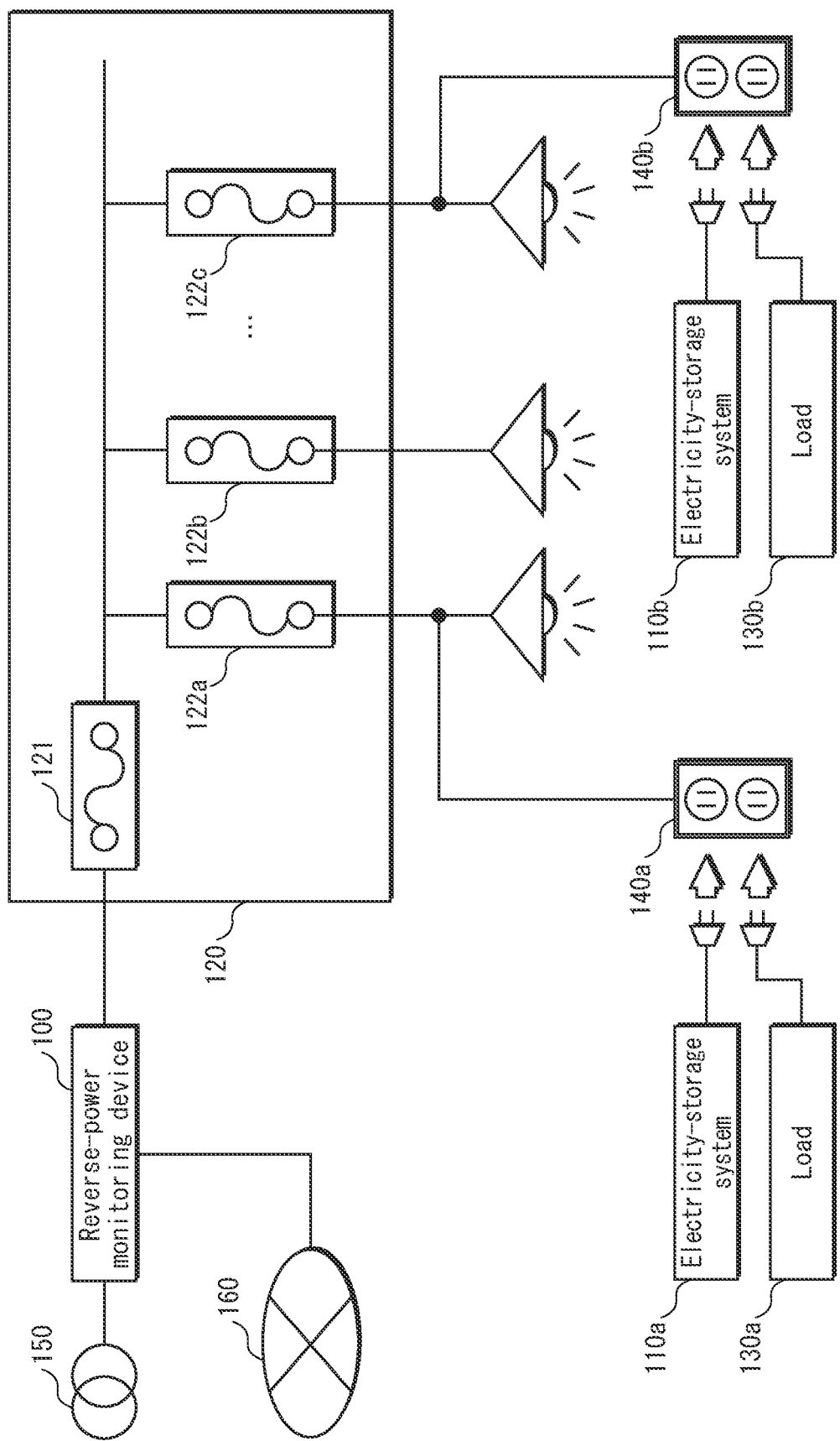
FIG. 1 is a system diagram showing a system configuration of a power control system.

FIG. 1 is a system diagram showing configuration of a power control system. As shown in FIG. 1, the power control system includes a reverse-power monitoring device 100 and electricity-storage systems 110a, 110b connected to a power line network downstream of the reverse-power monitoring device 100. The reverse-power monitoring device 100 is connected to an electrical grid 150 upstream and to a distribution panel 120 downstream. Further, aside from the electrical grid 150 and the distribution panel 120, the reverse-power monitoring device 100 is also connected to a network 160. The distribution panel 120 is connected to the electricity-storage systems 110a, 110b and loads 130a, 130b via the power line network and electrical outlets 140a, 140b.

In the present embodiment, in order to simplify explanation, upstream of the reverse-power monitoring device 100 is referred to as the electrical grid and downstream of the reverse-power monitoring device 100 is referred to as the power line network. However, the power line network is still part of the electrical grid. Here, the power line network is a closed system, i.e. a network whose power supply passes through the reverse-power monitoring device 100 or is not received from a power company. Further, the power line network is also referred to as a system relay or simply a system.

The reverse-power monitoring device 100 has a function of issuing instructions to discharge and stop discharge to the electricity-storage systems 110a, 110b connected to the power line network and has a function of monitoring whether or not reverse flow of power discharged from the electricity-storage systems 110a, 110b occurs, from the power line network to the electrical grid 150. Details of the reverse-power monitoring device 100 are provided later.

The distribution panel 120 is composed of a main breaker 121 and breakers 122a, 122b, 122c.

Downstream of the breakers 122a, 122b, 122c is lighting equipment such as interior lights, the electrical outlets 140a, 140b for supplying power to loads such as household appliances, etc. In FIG. 1, in addition to lighting equipment being disposed downstream of each breaker, the electrical outlet 140a is disposed downstream of the breaker 122a and the electrical outlet 140b is disposed downstream of the breaker 122c.

The main breaker 121 and the breakers 122a, 122b, 122c are typical circuit breakers that each have a function of breaking a circuit when abnormal current is detected in the power line network downstream of the circuit breaker.

The electricity-storage systems 110a, 110b have functions of charging by receiving supply of power from the power line network and discharging power to the power line network as a result of being connected to the electrical outlet 140a, the electrical outlet 140b, etc. Details of the electricity-storage systems 110a, 110b are provided later.

Each of the loads 130a, 130b is a household appliance, for example a PC, refrigerator, TV, vacuum cleaner, etc., that receives power supply from the power line network by connection of a plug to one of the electrical outlet 140a and the electrical outlet 140b. Each of the loads 130a, 130b has a function of sending a notification of an ID and a load capacity according to a request from the reverse-power monitoring device 100.

Figure 2:
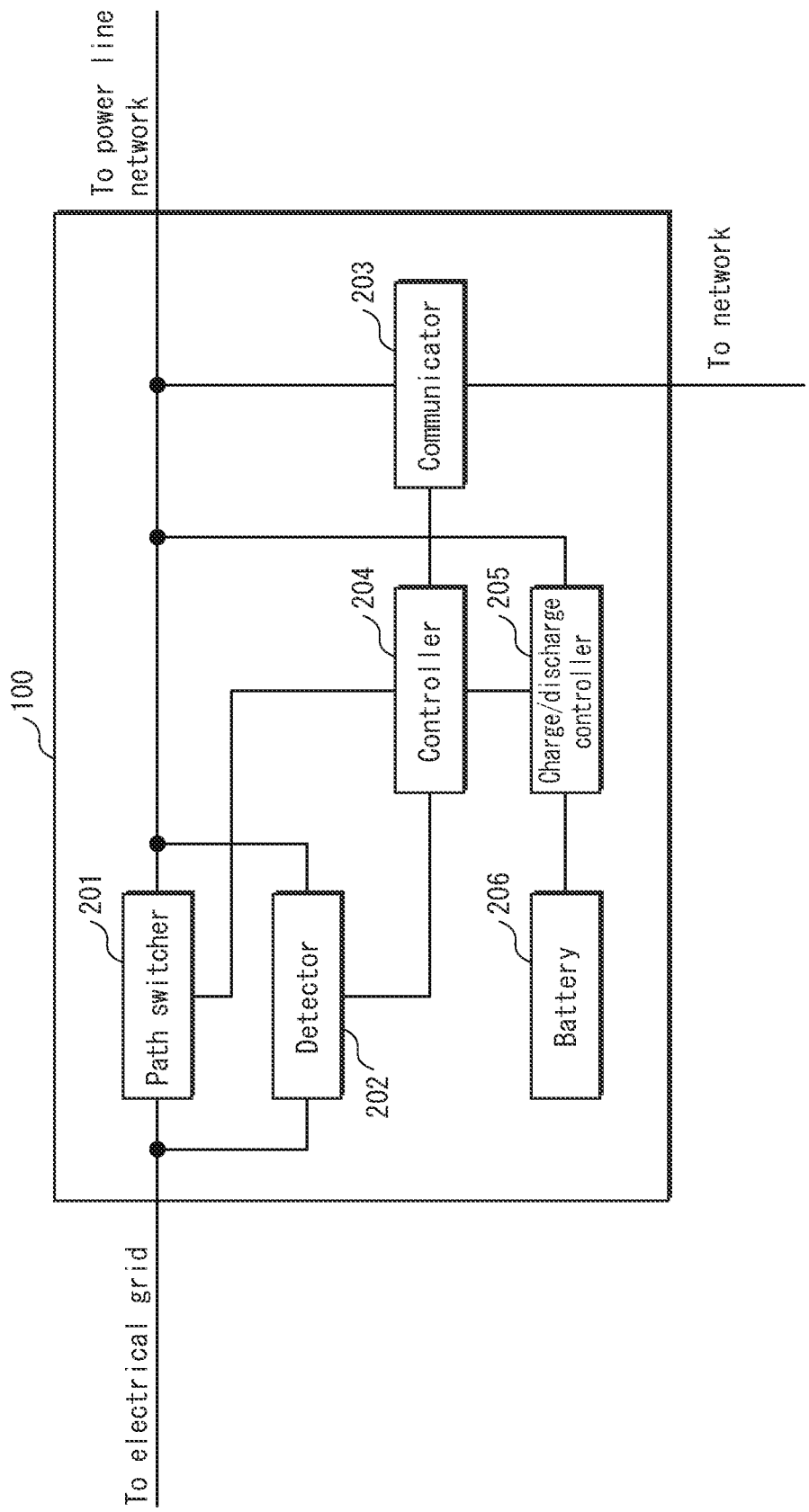
FIG. 2 is a function block diagram showing function configuration of a reverse-power monitoring device 100.

FIG. 2 is a function block diagram showing function configuration of the reverse-power monitoring device 100.

As shown in FIG. 2, the reverse-power monitoring device 100 includes a path switcher 201, a detector 202, a communicator 203, a controller 204, a charge/discharge controller 205, and a battery 206.

The path switcher 201 is inserted into a power line connecting the electrical grid 150 and the power line network and is a switch having a function of switching between states of physically disconnecting and connecting the electrical grid 150 and the power line network.

The detector 202 has a function of detecting power stoppages and a function of detecting power restoration after a power stoppage.

The detector 202 detects power stoppage and power restoration occurrences by detecting potentials of the electrical grid 150 and the power line network.

The detector 202 has a function of executing detection shown in table 1, below, based on system interconnection safeguards.

TABLE 1

| Protective relay class | Standard setting value (Setting range example) | | Setting range example | |
|---|---|---|---|---|
| | Detection level | Detection time | Conditions and controls | Notes |
| Over voltage relay (OVR) | 115% (110% to 120%) | 1 s (0.5 s to 2 s) | Detects when generated voltage of power equipment rises abnormally, and disconnects | |
| Under voltage relay (UVR) | 80% (80% to 90%) | 1 s (0.5 s to 2 s) | Detects when generated voltage of power equipment falls abnormally, and disconnects | |
| Over frequency relay (OFR) | 51.0 Hz/ 61.2 Hz (50.5 Hz to 51.5 Hz)/ (60.6 Hz to 61.6 Hz) | 1 s (0.5 s to 2 s) | Detects when a frequency increase is produced by islanding, and disconnects | Grounds when there is reverse power flow |
| Under frequency relay (UFR) | 51.0 Hz/ 61.2 Hz (48.5 Hz to 49.5 Hz)/ (58.2 Hz to 59.4 Hz) | 1 s (0.5 s to 2 s) | Detects when a frequency decrease is produced by islanding, and disconnects | No operation |
| Reverse power relay (RPR) | Approximately 5% of the inverter rated output | 0.5 s | Detects when reverse power flow occurs due to islanding, and disconnects | Grounds when there is no reverse power flow. |
| Islanding detection function | Corresponds to cases of low voltage interconnection | | Detects when an islanding state occurs, and disconnects | Improvements in detection reliability by combinations of passive methods and active methods |

Specifically, the detector 202 has, for each class in table 1, a function of detecting power stoppage and power restoration by determining whether or not an actual value of the class is within a range of standard setting values based on a standard setting value corresponding to the class. In table 1, the setting range examples enclosed by brackets under the standard setting values show example ranges that can be used as standard setting values. For example, in the case of over voltage, the detector 202 determines whether or not a state in which voltage of the electrical grid 150 is at least a predetermined standard voltage of 115% continues for at least one second, and when the state of at least 115% continues for at least one second, determines that an abnormality, i.e. power stoppage, has occurred. Subsequently, the detector 202 notifies the controller 204 of power stoppage detection and the controller 204, as shown under "conditions and controls", executes disconnection via the path switcher 201. In this way the detector 202 detects power stoppage when, for each class, the detector 202 detects a state exceeding (or below) a detection level for a time shown under "detection time". Further, the detector 202 detects power restoration when determining, for each class, that an actual value is within a standard setting value. The frequency in table 1 is a frequency of AC power flowing through the electrical grid 150. In table 1, setting values are according to the two cases: a case in which the standard frequency of commercial power used is 50 Hz and a case in which the standard frequency is 60 Hz. Further, reverse power flow is considered to be power flowing from the reverse-power monitoring device 100 to the electrical grid 150. Table 1 is a table in which setting values are determined in accordance with standards of commercial power in Japan, and a in a case in which power of a different frequency band to those of Japan is used, the setting values require altering in connection with the different frequency band.

In this way, the detector 202 performs detection of power stoppage and power restoration using table 1.

Further, when power stoppage is detected the detector 202 communicates that to the controller 204 and when power restoration is detected after power stoppage, the detector 202 communicates that to the controller 204.

The communicator 203 has a function of communicating, via the power line network, between the electricity-storage systems and the loads, by using power line communication (PLC). The communicator 203, specifically, has functions of: decoding data received from the electricity-storage systems or the loads and transmitting it to the controller 204; and coding data transmitted from the controller 204 and transmitting it to the electricity-storage systems or the loads.

Further, the communicator 203 has a function of communicating, via the network 160, with devices connected to the network 160, i.e. a network other than the power line network.

The controller 204 has a function of controlling each element of the reverse-power monitoring device 100. The controller 204 has functions primarily for executing: information collection processing, i.e. collecting information related to devices such as the electricity-storage systems and electrical appliances connected to the power line network; power peak shift processing, i.e. causing the electricity-storage systems to charge and discharge in order to control power consumption in the power line network; power stoppage processing when power stoppage occurs; and power restoration processing when power restoration occurs after power stoppage.

Further, the controller 204 detects whether or not there is a possibility of reverse power flow occurring, based on held electricity-storage system information and load information. The electricity-storage system information includes information about a discharge amount of each electricity-storage system connected to the power line network. The load information includes information about load capacity. Details of the electricity-storage system information and the load information are provided later. The controller 204 detects that reverse power flow is a possibility when a sum of load capacity of all loads included in the load information is less than or equal to a discharge amount of the electricity-storage systems executing discharge. In other cases, the controller 204 determines that the possibility of reverse power flow is low.

First, the information collection processing is described below.

In order to periodically acquire information of devices connected to the power line network, the controller 204 causes the communicator 203 to transmit response requests for requesting information of each device. Thus, with respect to the response requests, the controller 204 has a function of receiving responses transmitted from each of the electricity-storage systems and each of the loads and thereby updating the electricity-storage system information and the load information.

In a case in which the controller 204 receives a response from the electricity-storage systems in response to a response request, the controller 204 extracts the electricity-storage system ID, discharge amount, and state of charge contained in the response. Subsequently, the controller 204 updates the discharge amount and state of charge of electricity-storage system information corresponding to the electricity-storage system ID included in the response. In a case in which the electricity-storage system ID included in the response is not present in the electricity-storage system information, the controller 204 adds the electricity-storage system ID to the electricity-storage system information and links the discharge amount and the state of charge included in the response to the electricity-storage system ID. Further, when there is no response including an electricity-storage system ID included in the electricity-storage system information for at least a predefined period of time after transmitting the response request, the controller 204 deletes the discharge amount and state of charge information corresponding to the electricity-storage system ID from the electricity-storage system information.

Further, in a case in which the controller 204 receives a response from the loads in response to a response request, the controller 204 extracts the load ID and load capacity contained in the response. Subsequently, the controller 204 whether the load ID included in the response is included in the load information. In a case in which the load ID is not included in the load information, the controller 204 adds the load ID to the load information and links the load capacity included in the response to the load ID. In a case in which the load ID is included in the load information, the controller 204 does nothing. Further, when there is no response including a load ID included in the load information for at least a predefined period of time after transmitting the response request, the controller 204 deletes the load capacity information corresponding to the load ID from the load information.

Next, power peak shift processing is described below.

Power peak shift processing is processing for suppressing a peak of power usage in the power line network. Specifically, the controller 204 acquires, via the communicator 203 and the network 160, information related to transition of power usage in the power line network. The information is, for example, acquired from a power company. Subsequently, from acquired information pertaining to the transition of power usage, the controller 204 detects whether or not there is a possibility of reverse power flow in a time period in which power usage is greatest in one day, and in a case in which the controller determines that there is no possibility of reverse power flow, the controller 204 instructs the electricity-storage systems to discharge and suppresses power use from the power company. In a time period such as night-time when power used in the power line network decreases, when electricity rates are typically cheap, the controller 204 instructs the electricity-storage systems connected to the power line network to charge. According to this processing, peak power usage is decreased and therefore a decrease in electricity rates can be expected according to price schedules of electricity rates.

Finally, power stoppage processing and power restoration processing are described below.

The controller 204, when notified of detection of power stoppage by the detector 202, first executes disconnection. In other words, the controller 204 sets the path switcher 201 to a disconnected state. Subsequently, the controller 204 instructs, via the communicator 203, each of the electricity-storage systems connected to the power line network to stop discharge. This is to temporarily set (initialize) the discharge state in the power line network to a flat state. Subsequently, the controller 204 references the electricity-storage system information to select an electricity-storage system having a large discharge amount as an electricity-storage system to discharge a reference voltage. In a case in which there are a plurality of identical discharge amounts, the controller 204 selects an electricity-storage system having a greatest state of charge among the plurality of identical discharge amounts. The controller 204 then instructs, via the communicator 203, the selected electricity-storage system to discharge a reference voltage. Subsequently, in a case in which another electricity-storage system is connected to the power line network, the controller instructs the other electricity-storage system to discharge. Here, a reference voltage is a voltage that becomes a reference for synchronizing phases of discharge when the other electricity-storage system discharges. For example, in Japan a reference voltage is 100 V at 50 Hz or 60 Hz.

After power stoppage, in a case in which the controller 204 is notified of detection of power restoration by the detector 202, the controller 204 instructs, via the communicator 203, each electricity-storage system connected to the power line network to stop discharge. After issuing the instruction to stop discharge, the controller 204 sets the path switcher 201 to a connected state, causing electrical connection. Subsequently, the controller 204 causes the electricity-storage systems to discharge as required, according to power peak shift processing.

The controller 204 also has a function of, when the controller 204 receives a notification of detection of power stoppage from the detector 202, instructing the charge/discharge controller 205 to discharge and, at a predetermined time, instructing the charge/discharge controller 205 to charge.

The charge/discharge controller 205 has a function of instructing the battery 206 to charge and discharge according to instruction from the controller 204.

The battery 206 has a function of receiving power from the power line network via the charge/discharge controller 205 to charge a battery cell, and a function of discharging according to instruction from the charge/discharge controller 205. The battery 206 is a power source for operation of the reverse-power monitoring device 100 during power stoppage, etc.

Figure 3:
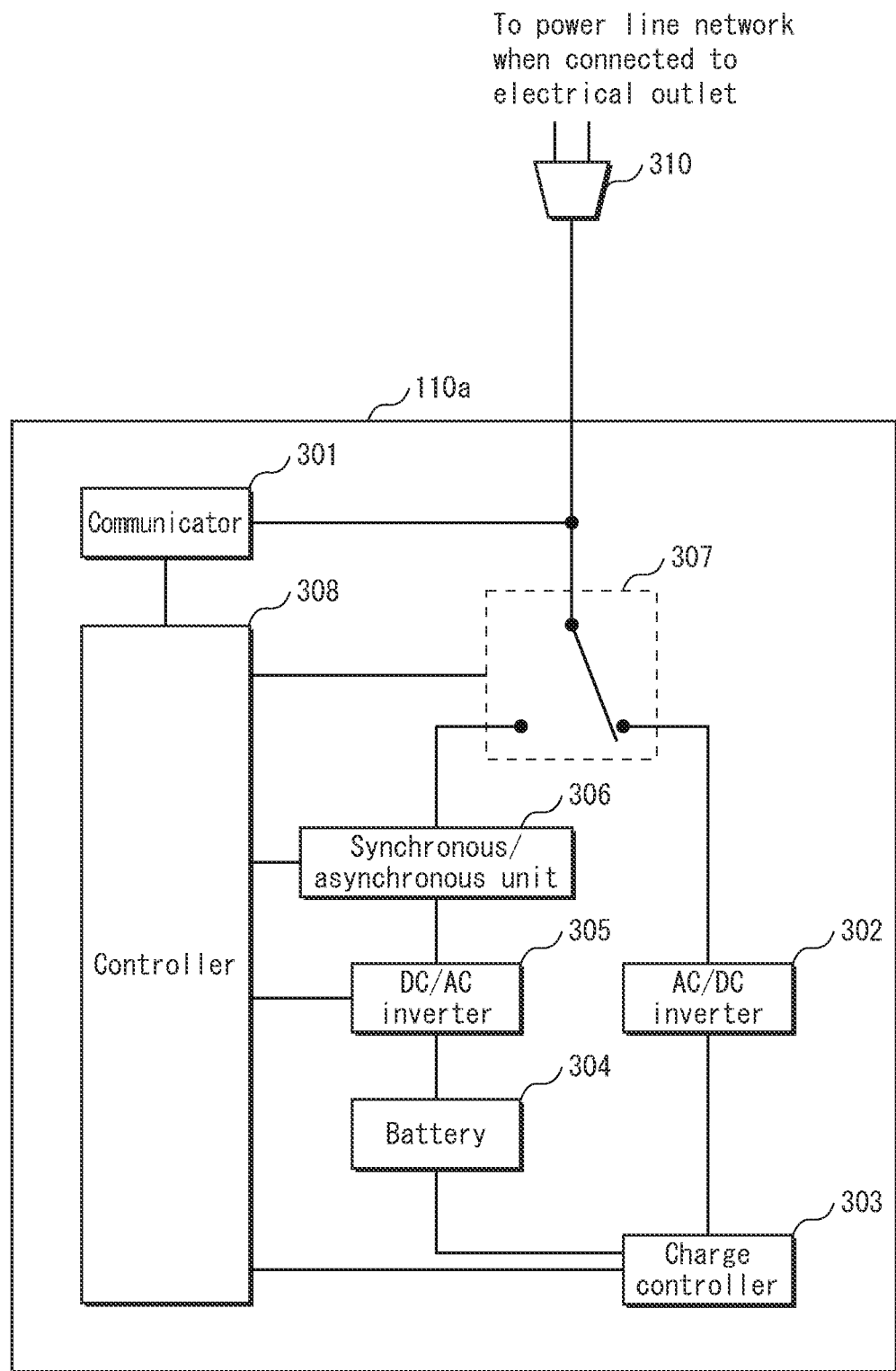

FIG. 3 is a function block diagram showing function configuration of the electricity-storage systems 110a, 110b.

The electricity-storage systems 110a, 110b are provided with identical configurations, and therefore here the configuration of the electricity-storage system 110a is described.

As shown in FIG. 3, the electricity-storage system 110a includes a communicator 301, an ACDC inverter 302, a charge controller 303, a battery 304, a DCAC inverter 305, a synchronous/asynchronous unit 306, a switch 307, and a controller 308.

The communicator 301 has a function of communicating with the reverse-power monitoring device 100 by using PLC, via an AC plug 310 and through the power line network. The communicator 301 has a function of decoding a signal received from the reverse-power monitoring device 100 via the power line network and transmitting the signal to the controller 308 and a function of coding a signal transmitted from the controller 308 and transmitting the coded signal to the reverse-power monitoring device 100 via the power line network.

The ACDC inverter 302 has a function of converting AC power supplied from the power line network via the switch 307 into DC power, and outputting the DC power to the charge controller 303.

The charge controller 303 has a function of charging the battery 304 according to instruction from the controller 308.

The battery 304 is a secondary battery, for example a lithium ion battery, having a function of receiving power supplied from the charge controller 303 to charge a battery cell and a function of discharging according to instruction from the controller 308.

The DCAC inverter 305 has a function of converting DC power supplied from the battery 304 into AC power, and outputting the AC power to the synchronous/asynchronous unit 306.

The synchronous/asynchronous unit 306 has a function of outputting AC power supplied from the DCAC inverter 305 to the power line network via the AC plug 310, according to instruction from the controller 308.

The synchronous/asynchronous unit 306, upon being instructed to synchronize and output power by the controller 308, first detects a phase of power flowing through the power line network. Subsequently, the synchronous/asynchronous unit 306 adjusts phase of the AC power supplied from the DCAC inverter 305 to match the phase detected, and then outputs the AC power after adjusting the phase to the power line network via the switch 307 and the AC plug 310.

On the other hand, upon being instructed to output a reference voltage by the controller 308, the synchronous/asynchronous unit 306 causes AC power supplied from the DCAC inverter to flow "as is" to the switch 307 and the AC power is outputted to the power line network via the AC plug 310.

The switch 307 has a function of switching between a state of connecting the AC plug 310 and either a charging side or a discharging side, according to instruction from the controller 308.

The controller 308 has a function of controlling each element of the electricity-storage system 110a.

The controller 308, upon receiving a response request from the reverse-power monitoring device 100 from the communicator 301, detects a state of charge of the battery 304 and transmits to the communicator 301 a response in which the electricity-storage system ID, discharge amount, and state of charge of the electricity-storage system 110a are linked, so that the communicator 301 transmits the response to the reverse-power monitoring device 100.

Further, the controller 308, upon receiving a discharge stop instruction from the reverse-power monitoring device 100 from the communicator 301, sets the switch 307 to the charging side, i.e. connects the side of the ACDC inverter 302. In a case in which the side of the ACDC inverter 302 is already connected, switching of the switch 307 is not performed.

The controller 308, upon receiving a discharge instruction from the reverse-power monitoring device 100 from the communicator 301, determines whether or not the discharge instruction is a reference voltage discharge instruction. The controller 308 determines whether or not the discharge instruction is a reference voltage discharge instruction based on information included in the discharge instruction indicating whether or not the discharge instruction is a reference voltage discharge instruction.

In a case in which the discharge instruction is a reference voltage discharge instruction, the controller 308 instructs the synchronous/asynchronous unit 306 that synchronization is not required and sets the switch 307 to the side of the DCAC inverter 305. In this way, the electricity-storage system 110*a* discharges a reference voltage to the power line network. Here, a reference voltage means AC power that is a reference for synchronizing phase of AC power discharged by another electricity-storage system.

On the other hand, in a case in which the discharge instruction is not a reference voltage discharge instruction, the controller 308 instructs the synchronous/asynchronous unit 306 that synchronization is required and sets the switch 307 to the side of the DCAC inverter 305.

Further, the controller 308, upon receiving a discharge stop instruction from the reverse-power monitoring device 100 from the communicator 301, sets the switch 307 to the charging side, i.e. connects the side of the ACDC inverter 302. In a case in which the side of the ACDC inverter 302 is already connected, switching of the switch 307 is not performed.

<Data>

Each type of data used in the present embodiment is described below.

Figure 4A:
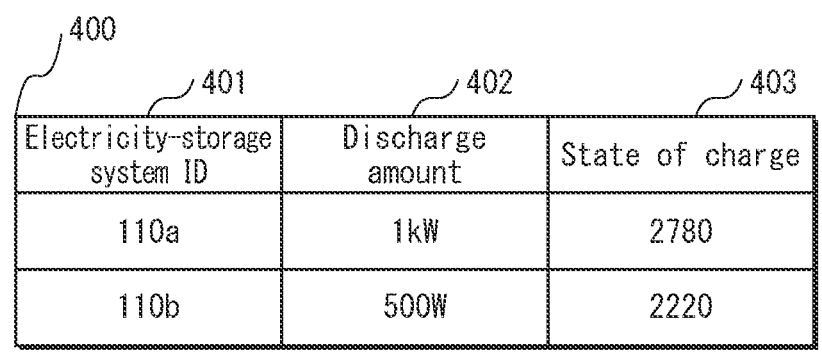
FIG. 4A shows electricity-storage system information.
Figure 4B:
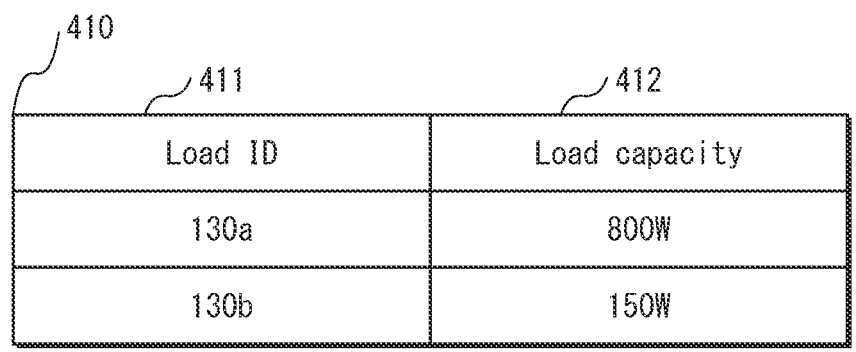
FIG. 4B shows load information.

FIG. 4A and FIG. 4B are data schematics of information used for monitoring occurrence of reverse power flow, held by the reverse-power monitoring device 100.

FIG. 4A is electricity-storage system information indicating information related to electricity-storage systems connected to the power line network. Further, FIG. 4B is load information indicating information related to loads connected to the power line network.

As shown in FIG. 4A, electricity-storage system information 400 is information in which an electricity-storage system ID 401, a discharge amount 402, and a state of charge 403 are linked.

The electricity-storage system ID 401 is an identifier for identifying an electricity-storage system connected to the power line network. For example, a unique device number held by an electricity-storage system, a MAC address, etc., may be used as an electricity-storage system ID.

The discharge amount 402 is information indicating a limit of discharge possible per unit of time by the corresponding electricity-storage system.

The state of charge 403 is information indicating an amount of power remaining in the corresponding electricity-storage system.

As shown in FIG. 4B, the load information 410 is information in which a load ID 411 and a load capacity 412 are linked.

The load ID 411 is an identifier for identifying a load connected to the power line network. For example, a unique device number held by a load, a MAC address, etc., may be used as a load ID.

The load capacity 412 is information indicating a load capacity of the corresponding load.

The above is a description of configuration of the electricity-storage system information 400 and the load information 410.

<Operation>

The following is a description of operation of the power control system. First, operation as a system is described, and subsequently, operations of each of the reverse-power monitoring device 100 and the electricity-storage system are described.

FIG. 5 is a sequence diagram showing operation of the power control system when the electricity-storage system is connected to the power line network.

As shown in FIG. 5, first, a new electricity-storage system is connected to the power control system (step S501). In other words, a plug of the new electricity-storage system is inserted into an electrical outlet.

The reverse-power monitoring device 100 transmits a response request to each device connected to the power line network in order to know the status of each such device (step S502).

Upon receiving the response request, the electricity-storage system acquires its own discharge amount and state of charge. Subsequently, information of the acquired discharge amount and state of charge is linked with the electricity-storage system's own electricity-storage system ID and transmitted to the reverse-power monitoring device 100 (step S503).

Upon receiving a response from the electricity-storage system, the reverse-power monitoring device 100 updates the electricity-storage system information based on information received (step S504).

The reverse-power monitoring device 100 periodically transmits response requests (step S505).

An electricity-storage system that receives the response request acquires its own discharge amount and state of charge. Subsequently, information of the acquired discharge amount and state of charge is linked with the electricity-storage system's own electricity-storage system ID and transmitted to the reverse-power monitoring device 100 (step S506).

Upon receiving a response from the electricity-storage system, the reverse-power monitoring device 100 updates the electricity-storage system information based on information received (step S507).

In this way, the reverse-power monitoring device 100 updates held electricity-storage system information and can cause an electricity-storage system connected to the power line network to charge and discharge as appropriate. Although not shown in FIG. 5, aside from the electricity-storage system, each load connected to the power line network also transmits information of load capacity in response to the response request, and thus the reverse-power monitoring device 100 updates load information.

Figure 6:
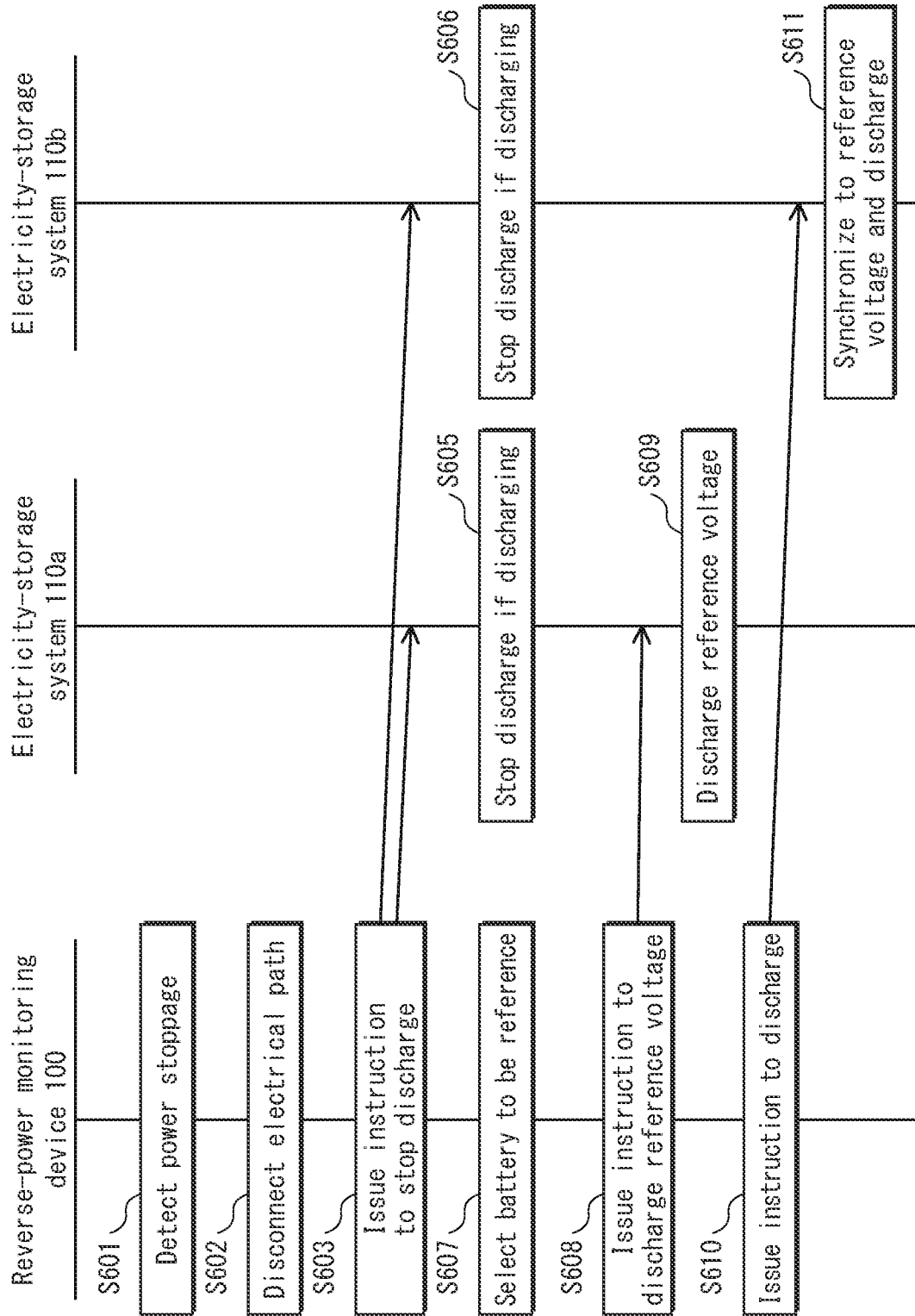
FIG. 6 is a sequence diagram showing operation of a power control system when power stoppage occurs.

FIG. 6 is a sequence diagram showing operation of the power control system when power stoppage occurs.

As shown in FIG. 6, the reverse-power monitoring device 100 detects power stoppage (step S601).

In such a case, the reverse-power monitoring device 100 executes disconnection (step S602) and subsequently instructs each electricity-storage system connected to the power line network to stop discharge (step S603).

The electricity-storage systems 110a, 110b each receive the instruction to stop discharge and when discharge is being executed, stop discharging (Step S605, Step S606).

The reverse-power monitoring device 100, after instructing to stop discharge, selects an electricity-storage system to discharge a reference voltage (step S607). In this example the electricity-storage system 110a is selected.

Subsequently, the reverse-power monitoring device 100 instructs the selected electricity-storage system to discharge a reference voltage (step S608). Here, the reverse-power monitoring device 100 instructs the electricity-storage system 110a to discharge a reference voltage.

The electricity-storage system 110a that has received the instruction starts discharging a reference voltage to the power line network (step S609).

The reverse-power monitoring device 100 then instructs the electricity-storage system 110b to discharge (step S610).

The electricity-storage system 110b that has received the instruction synchronizes with a reference voltage being discharged by the electricity-storage system 110a and discharges (step S611).

Thus, when power stoppage occurs, the power control system temporarily stops discharging in a case in which an electricity-storage system is discharging, and after executing disconnection, causes discharge from an electricity-storage system to compensate for the power stoppage in a way that does not cause reverse power flow.

Figure 7:
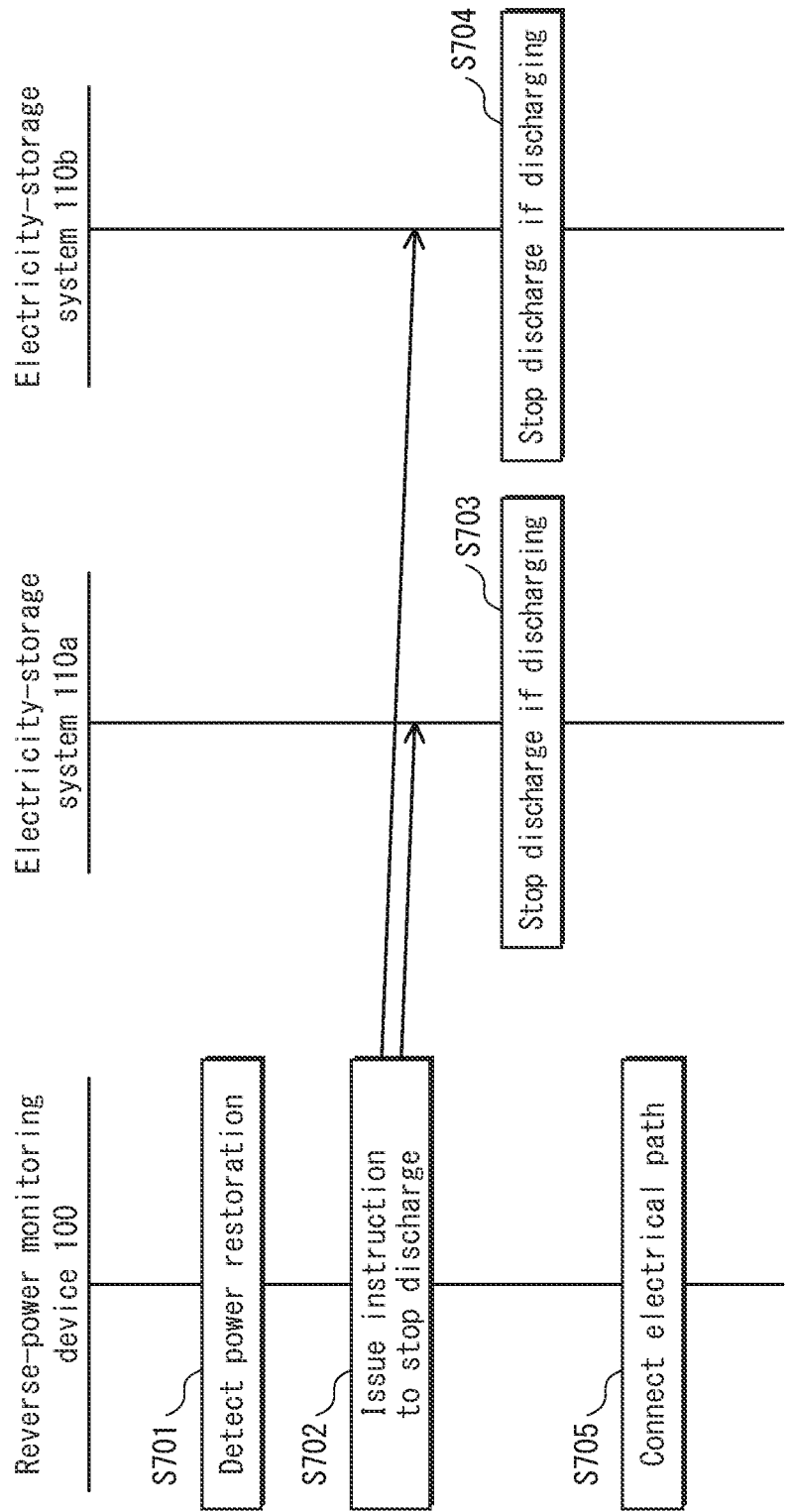
FIG. 7 is a sequence diagram showing operation of a power control system when power supply resumes after power stoppage.

FIG. 7 is a sequence diagram showing operation of the power control system when power restoration occurs after power stoppage.

After power stoppage, the reverse-power monitoring device 100 detects restoration of power in the electrical grid 150 (step S701).

Upon detecting power restoration, the reverse-power monitoring device 100 first instructs each electricity-storage system to stop discharge (step S702).

The electricity-storage systems 110a, 110b each receive the instruction to stop discharge and when discharge is being executed, stop discharging (Step S703, Step S704).

After outputting the instruction to stop discharge, the reverse-power monitoring device 100 causes the path switcher 201 to connect so that power supply is received (step S705).

According to this power restoration processing, the power control system can restore power from a state of power stoppage and return to normal operation.

The following describes operations of the reverse-power monitoring device 100 and the electricity-storage system 110a for implementing the sequences shown in FIGS. 5-7.

Figure 8:
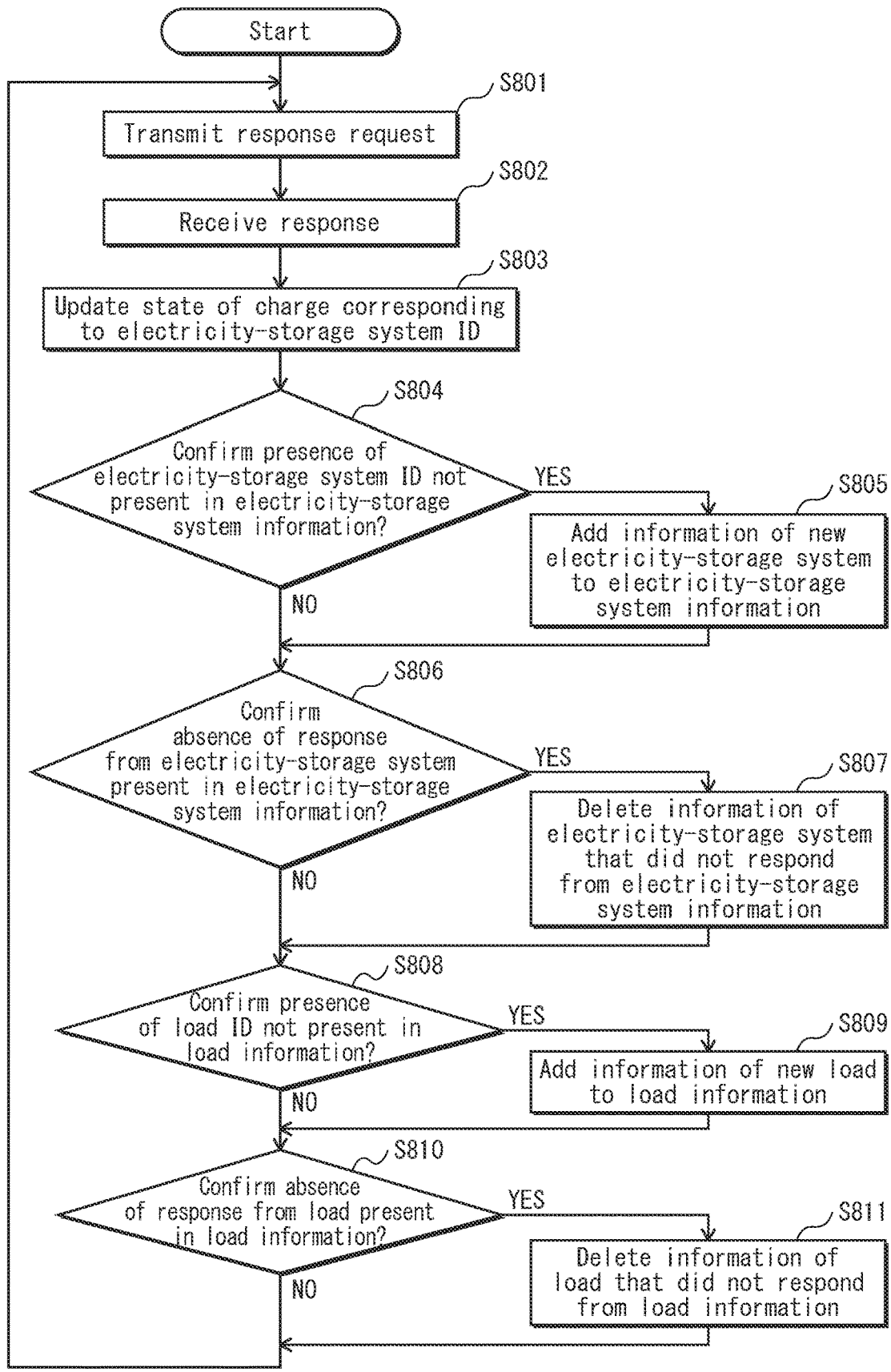
FIG. 8 is a flowchart showing operation pertaining to the reverse-power monitoring device 100 updating electricity-storage system information 400 and load information 410.
Figure 9:
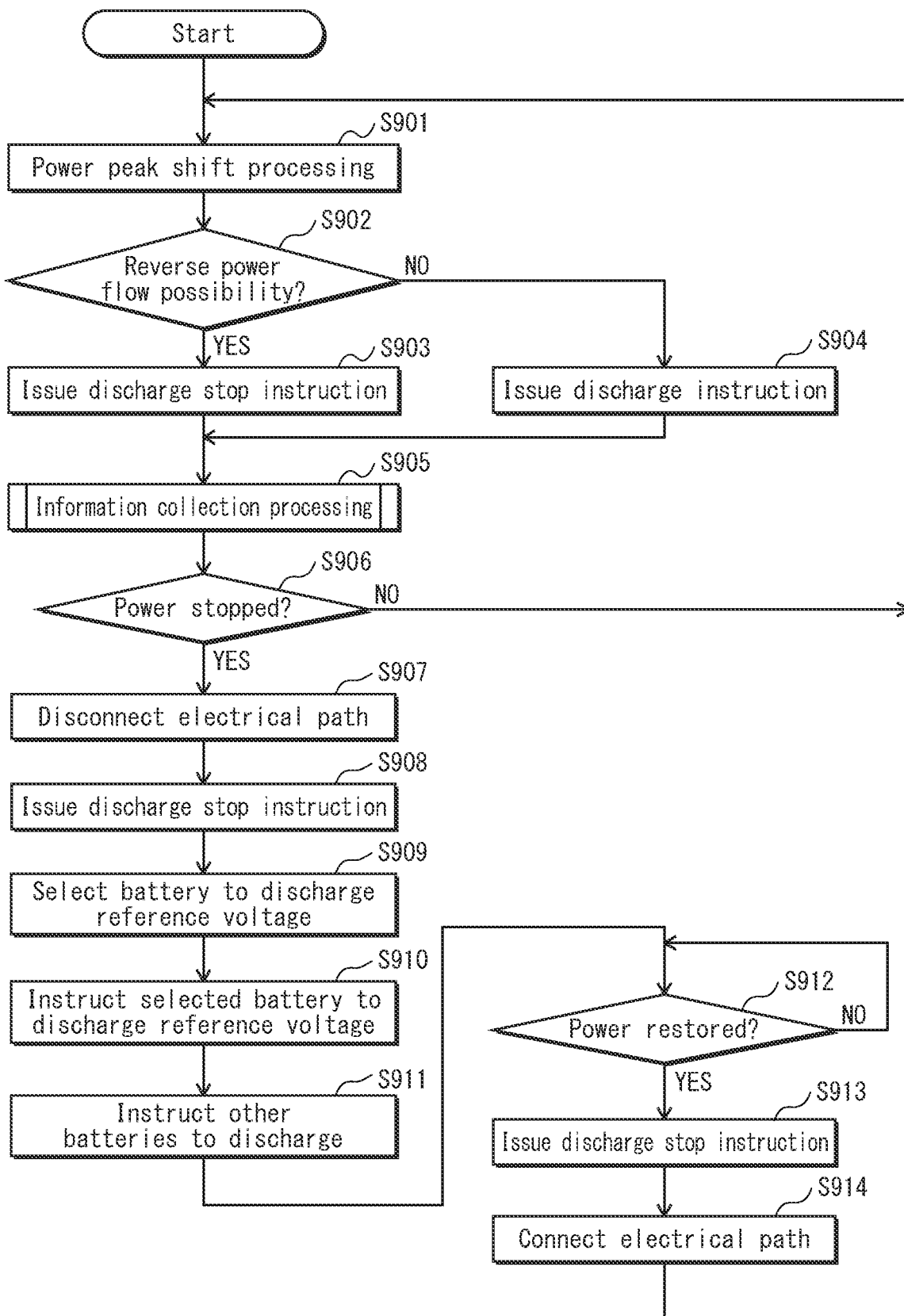
FIG. 9 is a flowchart showing operation pertaining to discharge from a battery according to the reverse-power monitoring device 100.

First, operation of the reverse-power monitoring device 100 is shown by using FIG. 8 and FIG. 9.

FIG. 8 is a flowchart showing an information collection processing operation pertaining to the reverse-power monitoring device 100 updating the electricity storage system information 400 and the load information 410.

The controller 204 periodically instructs the communicator 203 to transmit a response request in order to collect information about the electricity-storage systems and loads connected to the power line network.

The communicator 203 receives a response from each electricity-storage system and load connected to the power line network (step S802).

Upon receiving a response via the communicator 203, the controller 204 first, in a case in which electricity-storage system information is present and corresponds to an electricity-storage system ID included in the response from an electricity-storage system, updates a state of charge corresponding to the electricity-storage system information with a value of a state of charge included in the response (step S803).

In a case in which the response is from an electricity-storage system and includes an electricity-storage system ID that is not present in the electricity-storage system information 400 (YES at step S804), the electricity-storage system ID is added to the electricity-storage system information 400 and linked to a discharge amount and a state of charge included in the response, updating the electricity-storage system information 400 (step S805).

Next, the controller 204 checks whether or not there is an electricity-storage system that has not responded for at least a predetermined length of time according to the electricity-storage system information (step S806).

In a case in which there is an electricity-storage system ID in the electricity-storage system information for an electricity-storage system that has not responded (YES at step S806), the controller 204 deletes the electricity-storage system ID and linked discharge amount and state of charge of the electricity-storage system from the electricity-storage system information (step S807). In a case in which an electricity-storage system ID for an electricity-storage system that has not responded is not present in the electricity-storage system information, i.e., a response is received from every electricity-storage system corresponding to the electricity-storage system IDs included in the electricity-storage system information 400 (NO at step S806), processing proceeds to step S808.

The controller 204 then determines, with respect to a response transmitted from a load in response to the response request, whether or not a load ID included in the response is included in the load information (step S808).

In a case in which a load ID not present in the load information is included in the response (YES at step S808), the controller 204 links a load capacity included in the response to the load ID and records the load ID and the load capacity in the load information (step S809).

Next, the controller 204 checks whether or not there is a load that has not responded for at least a predetermined length of time according to the load information (step S810).

In a case in which there is a load ID in the load information for a load that has not responded (YES at step S810), the controller 204 deletes the load ID and linked load capacity of the load from the load information (step S811). In a case in which a load ID for a load that has not responded is not present in the load information, i.e., a response is received from every load corresponding to the load IDs included in the load information 410 (NO at step S810), processing returns to step S801.

The above is a description of information collection processing, which the reverse-power monitoring device 100 periodically executes.

FIG. 9 is a flowchart showing operation of power control processing according to the reverse-power monitoring device 100.

As shown in FIG. 9, the reverse-power monitoring device 100 executes power peak shift processing (step S901). As described above, power peak shift processing is processing for reducing a total amount of electrical power used by the power line network and is executed based on information related to power use trends in the power line network acquired by the communicator 203 via the network 160.

The reverse-power monitoring device 100 executes reverse power detection processing. The reverse-power monitoring device 100 determines that there is a possibility of reverse flow in a case in which a total load capacity of all loads included in the load information does not exceed a total discharge amount of electricity-storage systems executing discharge included in the electricity-storage system information (step S902).

In a case in which a possibility of reverse flow is positively determined (YES at step S902), the controller 204 transmits a discharge stop instruction to at least one electricity-storage system via the communicator 203 (step S903). In a case in which a low possibility of reverse flow is determined (NO at step S902), the controller 204 transmits a discharge instruction to at least one electricity-storage system via the communicator 203 (step S904).

In a case in which the detector 202 of the reverse-power monitoring device 100 detects a power stoppage (step S905), the detector 202 notifies the controller 204 of the power stoppage detection. Upon receiving the notification the controller 204 executes disconnection via the path switcher 201 (step S906).

Subsequently, the controller 204 transmits a discharge stop instruction to each of the electricity-storage systems via the communicator 203 (step S907).

After transmitting the discharge stop instruction, the controller 204 selects an electricity-storage system to discharge a reference voltage during power stoppage (step S908). The controller 204 refers to the electricity-storage system information and selects the electricity-storage system having the highest discharge amount to control. In a case in which there is a plurality of electricity-storage systems having the highest discharge amount, the controller 204 selects an electricity-storage system having a greatest state of charge among the plurality.

Subsequently, via the communicator 203, the controller 204 instructs the selected electricity-storage system to discharge a reference voltage (step S909). The electricity-storage system that receives a reference voltage discharge instruction discharges power asynchronously to the power line network.

The controller instructs electricity-storage systems other than the selected electricity-storage system to simply discharge (step S910). The electricity-storage system that receives a normal discharge instruction discharges power to the power line network that is synchronized to the phase of AC power flowing through the power line network.

After power stoppage occurs, the detector 202 detects potentials of the electrical grid 150 to detect whether or not power restoration has occurred (step S912). Upon detecting power restoration (YES at step S912), the detector 202 notifies the controller 204 of the power restoration.

Upon receiving the notification of power restoration, the controller 204 transmits, via the communicator 203, an instruction to each of the electricity-storage systems to stop discharge (step S913). The electricity-storage systems each receive the instruction to stop discharge and when discharge is being executed, stop discharging.

Subsequently, the controller 204 causes the path switcher 201 to connect, thereby causing power to flow from the electrical grid 150 to the power line network (step S914).

The above is a description of processing pertaining to power control according to the reverse-power monitoring device 100. The processing shown in FIG. 9 is repeatedly executed.

Figure 10:
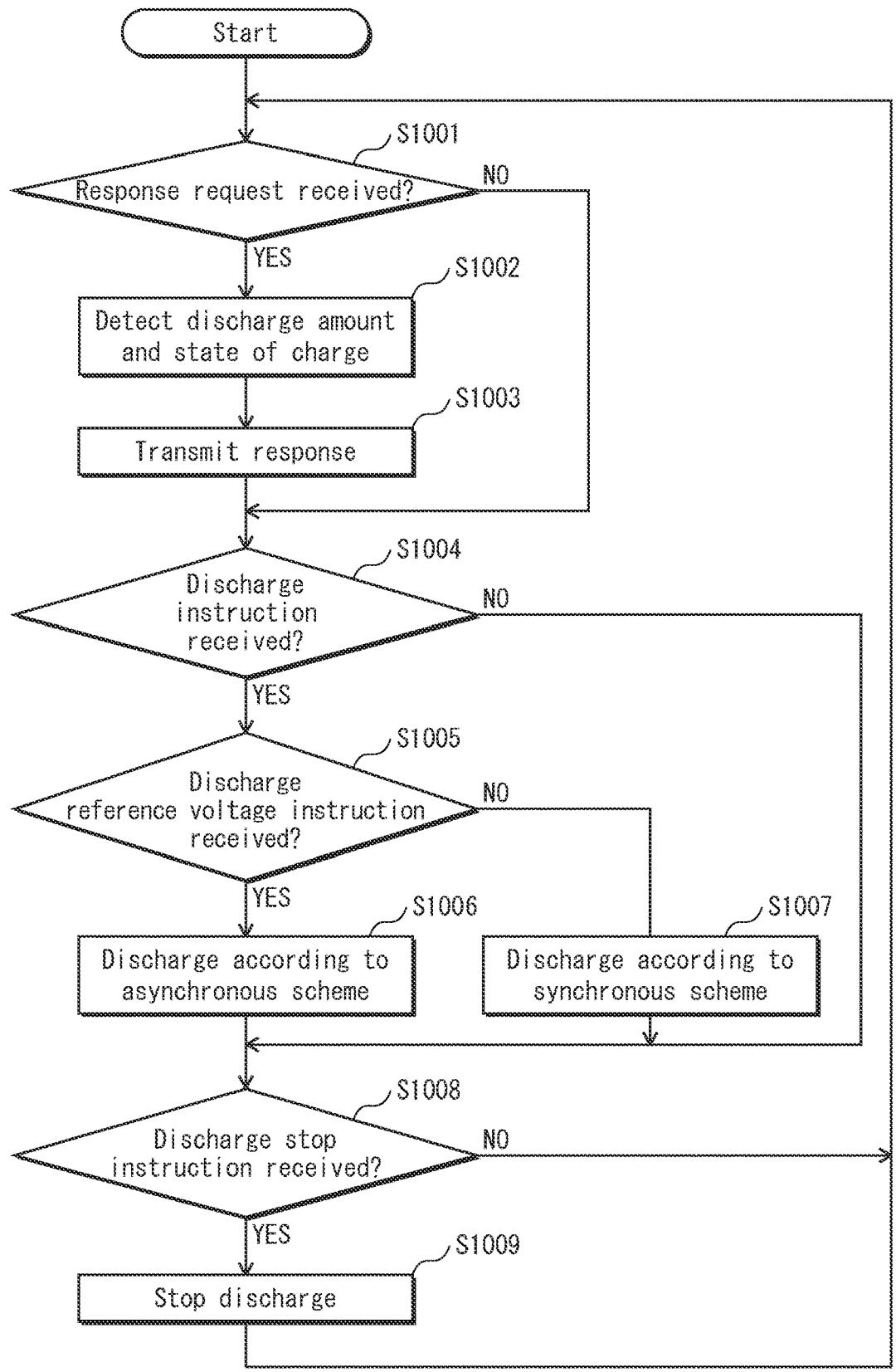
FIG. 10 is a flowchart showing operation of a battery.

FIG. 10 is a flowchart showing operation of an electricity-storage system. Description is of operation of the electricity-storage system 110a, but the electricity-storage system 110b operates the same way.

The communicator 301 receives a signal from the reverse-power monitoring device 100 via an AC plug by using PLC.

The controller 308, in a case in which a signal received from the communicator 301 is a response request (YES at step S1001), acquires a discharge amount and state of charge of the battery 304 (step S1002). Subsequently, the controller 308 causes the communicator 301 to transmit a response in which the electricity-storage system ID, the discharge amount, and the state of charge of the electricity-storage system are linked (step S1003).

The controller 308, in a case in which a signal received from the communicator 301 is a discharge instruction (YES at step S1004), determines whether or not the discharge instruction is a reference voltage discharge instruction (step S1005). The determination is performed based on a flag included in the discharge instruction that indicates whether or not the discharge instruction is a reference voltage discharge instruction.

In a case in which the discharge instruction is a reference voltage discharge instruction (YES at step S1005), the controller 308 outputs an instruction for asynchronous output to the synchronous/asynchronous unit 306. Subsequently, the switch 307 switches to the side of the DCAC inverter 305. In this way, a reference voltage is outputted to the power line network.

In a case in which the discharge instruction is not a reference voltage discharge instruction (NO at step S1005), the controller 308 outputs an instruction for synchronous output to the synchronous/asynchronous unit 306. Subsequently, the switch 307 switches to the side of the DCAC inverter 305. The synchronous/asynchronous unit 306 detects the phase of AC power flowing to the power line network and adjusts the phase of AC power outputted from the DCAC inverter 305 to synchronize, i.e. match phase, with power flowing to the power line network, in order to output the AC power to the power line network. In this way, supply of power to the power line network from the electricity-storage systems is performed, power insufficiency can be compensated for, and when a large amount of power is being used a portion of the power supplied from a power company can be reduced.

In a case in which a signal received from the communicator 301 is a discharge stop instruction (YES at step S1008), the controller 308 causes the switch 307 to switch to the side of the ACDC inverter 302 (step S1009) and processing returns to step S1001.

The above is a description of operation of the electricity-storage system 110a.

<Summary>

As indicated in embodiment 1, each of the electricity-storage systems does not discharge unless it receives a discharge instruction from the reverse-power monitoring device 100, and therefore the possibility of reverse power flow is as low as possible. This is because the reverse-power monitoring device 100 detects the presence and absence of the possibility of reverse power flow occurring and when determining that there is a possibility of reverse power flow a discharge instruction is not performed, thus reverse power flow can be prevented.

Embodiment 2

According to embodiment 1, above, the reverse-power monitoring device 100 detects power stoppage. According to embodiment 2, a case is described in which the electricity-storage systems, not the reverse-power monitoring device, detect power stoppage.

<Configuration>

Figure 11:
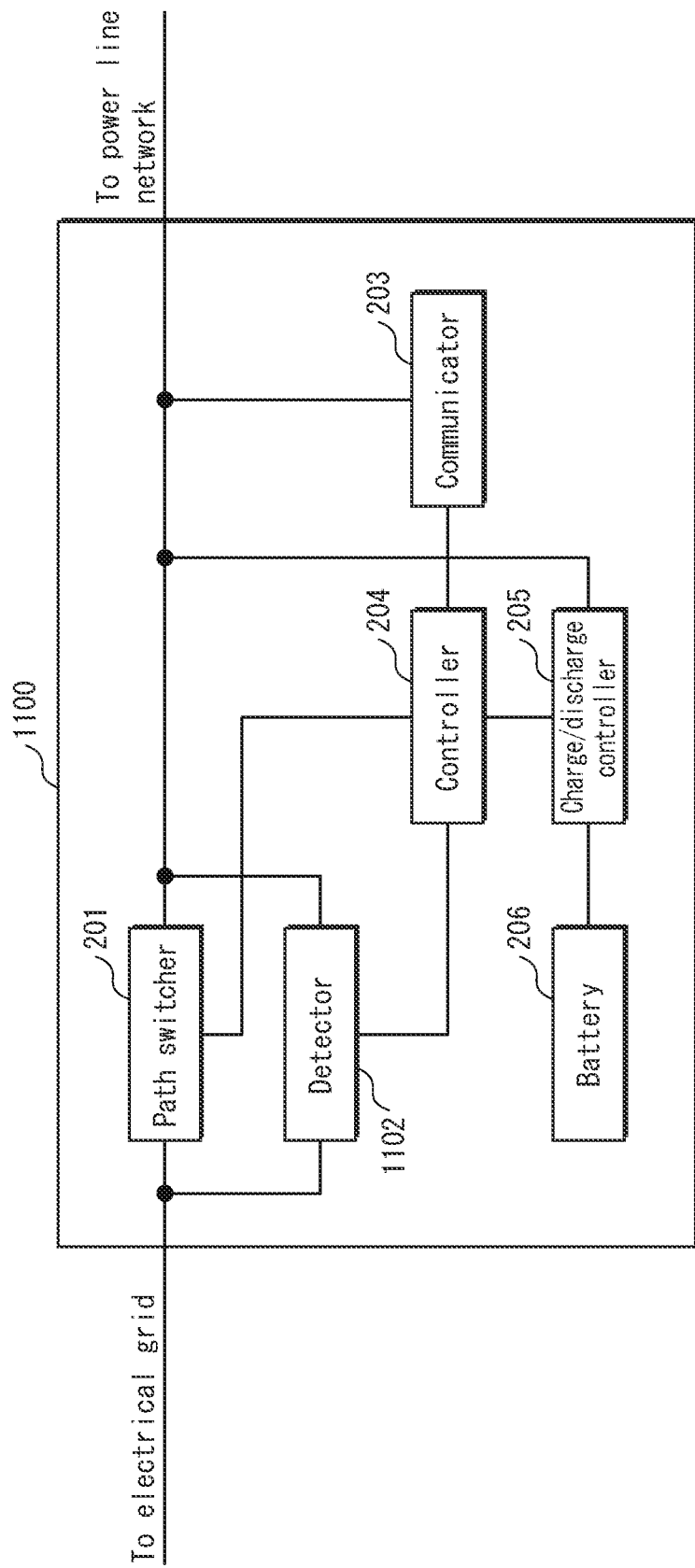
FIG. 11 is a function block diagram showing function configuration of a reverse-power monitoring device 1100 pertaining to embodiment 2.

FIG. 11 is a function block diagram showing configuration of a reverse-power monitoring device 1100 pertaining to embodiment 2.

The reverse-power monitoring device 1100 includes a detector 1102 instead of the detector 202.

The detector 1102 has a function, unlike the detector 202 of embodiment 1, of only detecting power restoration and not detecting power stoppage. In a case in which power restoration is detected, the detector 1102 transmits an indication thereof to the controller 1104.

The controller 1104 has functions approximately the same as those of the controller 204 indicated in embodiment 1, with a point of difference below.

The controller 1104 is not notified of power stoppage from the detector 1102 and is notified by reception of power stoppage information transmitted from the electricity-storage system via the communicator 203.

In a case in which power stoppage information is transmitted to the controller 1104 from the communicator 203, the controller 1104 executes power stoppage processing in the same way as the controller 204. In other words, the controller 1104 executes disconnection via the path switcher 201 and subsequently instructs each of the electricity-storage systems to stop discharge via the communicator 203. The controller 1104 then selects an electricity-storage system to discharge a reference voltage to instruct the selected electricity-storage system to discharge a reference voltage.

Figure 12:
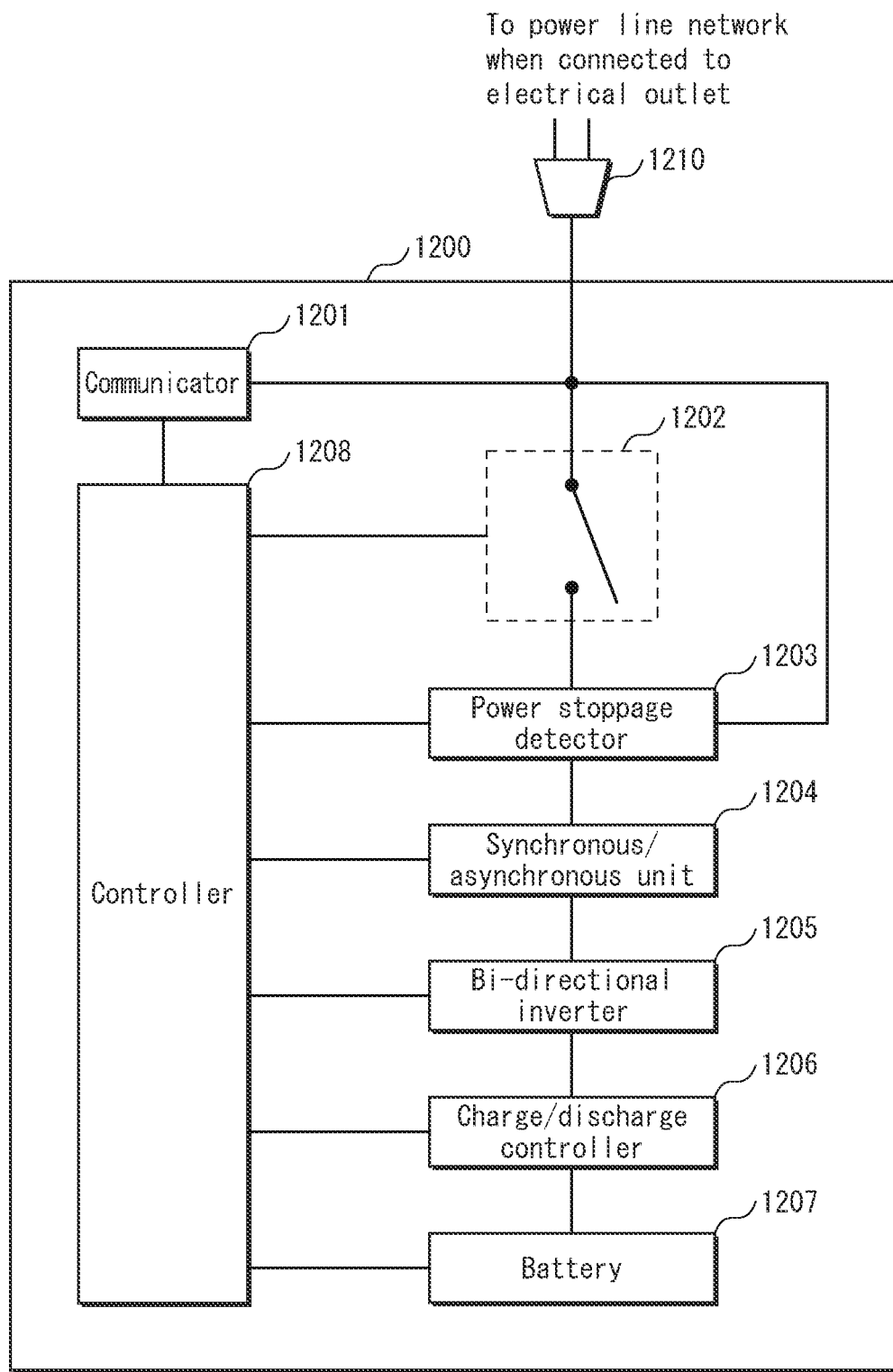
FIG. 12 is a function block diagram showing function configuration of an electricity-storage system 1200 pertaining to embodiment 2.

FIG. 12 is a function block diagram showing configuration of an electricity-storage system 1200 pertaining to embodiment 2. As shown in FIG. 12, the electricity-storage system 1200 includes a communicator 1201, a switch 1202, a power stoppage detector 1203, a synchronous/asynchronous unit 1204, a bi-directional inverter 1205, charge/discharge controller 1206, a battery 1207, and a controller 1208.

The communicator 1201 has a function of executing communication with the reverse-power monitoring device 1100 via an AC plug 1210, an electrical outlet, and the power line network.

The switch 1202 has a function of switching on and off according to instruction from the controller 1208.

The power stoppage detector 1203 has a function of detecting potentials of the power line network to determine whether or not power stoppage is occurring. In a case in which power stoppage is detected, the power stoppage detector 1203 has a function of transmitting an indication thereof to the controller 1208.

The synchronous/asynchronous unit 1204, during charging, allows power to flow to the bi-directional inverter 1205. Further, during discharging, when there is an instruction for synchronization from the controller 1208, the synchronous/asynchronous unit 1204 adjusts a phase of AC power supplied from the bi-directional inverter 1205 according to the notification of the phase of AC power from the controller 1208 then outputs to the power line network via the power stoppage detector 1203 and the switch 1202. When instructed to output a reference voltage, the synchronous/asynchronous unit 1204 outputs AC power supplied from the bi-directional inverter 1205 "as is" to the power line network via the power stoppage detector 1203 and the switch 1202.

The bi-directional inverter 1205 has a function of converting AC power to DC power and a function of converting DC power to AC power. The bi-directional inverter 1205, during charging, converts AC power flowing from the synchronous/asynchronous unit 1204 to DC power and outputs the DC power to the charge/discharge controller 1206 according to instruction from the controller 1208. Further, when discharging, the bi-directional inverter 1205 converts DC power transmitted from the charge/discharge controller 1206 to AC power and outputs the AC power to the synchronous/asynchronous unit 1204.

The charge/discharge controller 1206 has a function of charging the battery 1207 by receiving DC power from the bi-directional inverter 1205 and a function of outputting DC power received from the battery 1207 to the bi-directional inverter, both functions performed in accordance with instruction from the controller 1208.

The battery 1207 has a function of executing charging and discharging according to instruction from the charge/discharge controller 1206.

<Operation>

Figure 13:
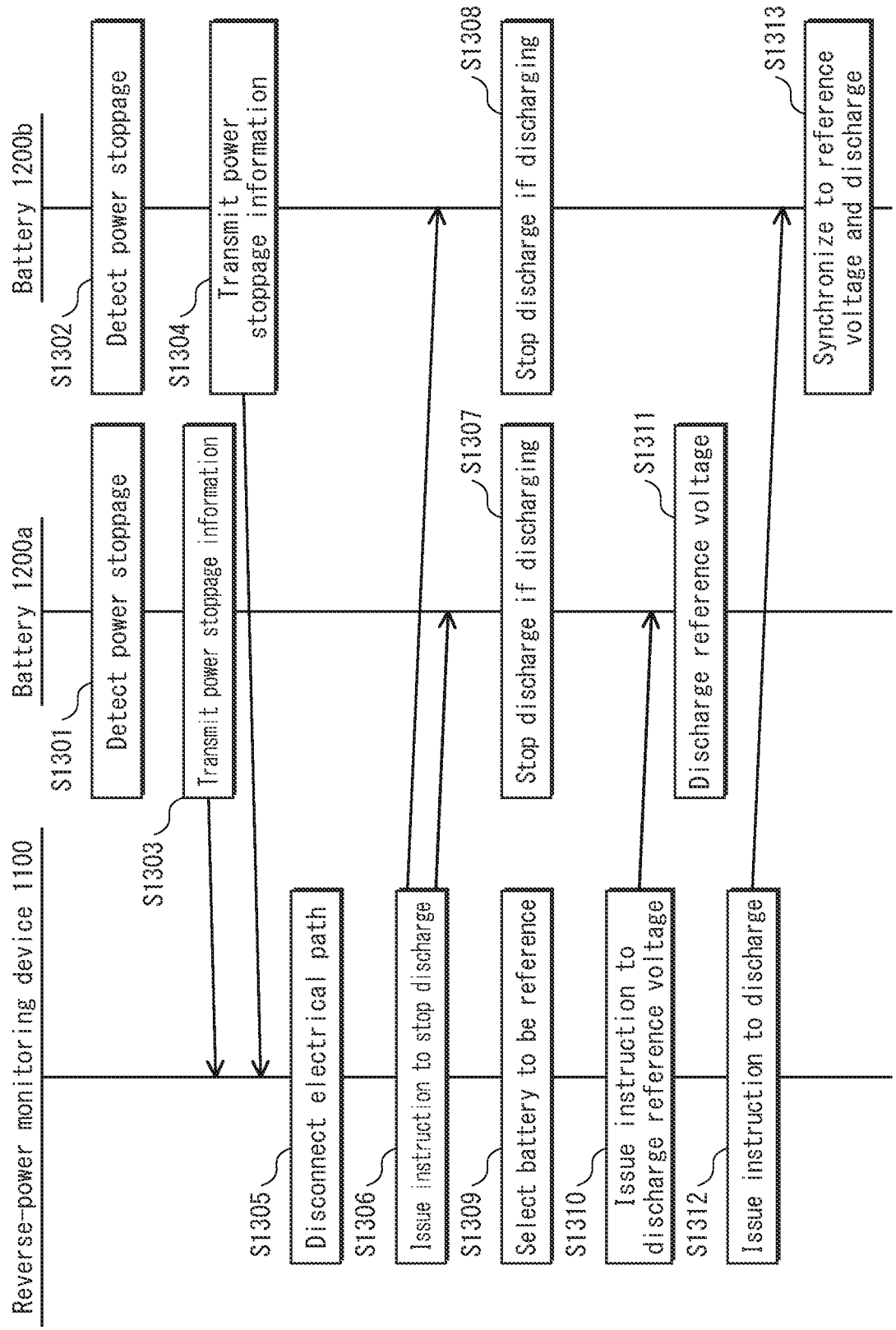
FIG. 13 is a sequence diagram showing operation, when power stoppage occurs, of a power control system pertaining to embodiment 2.

FIG. 13 is a sequence diagram showing operation, when power stoppage occurs, of the power control system pertaining to embodiment 2.

As shown in FIG. 13, when power stoppage occurs, each of the electricity-storage systems detects power stoppage (steps S1301, S1302).

An electricity-storage system 1200a that has detected the power stoppage transmits power stoppage information that indicates the occurrence of power stoppage to the reverse-power monitoring device 1100 (step S1303). Likewise, an electricity-storage system 1200b also transmits power stoppage information to the reverse-power monitoring device 100 (step S1304).

The reverse-power monitoring device 1100 that has received the power stoppage information sets the path switcher 201 to disconnect, thereby disconnecting (step S1305).

The following processing is identical to that described in FIG. 6 of embodiment 1, and therefore omitted here.

Figure 14:
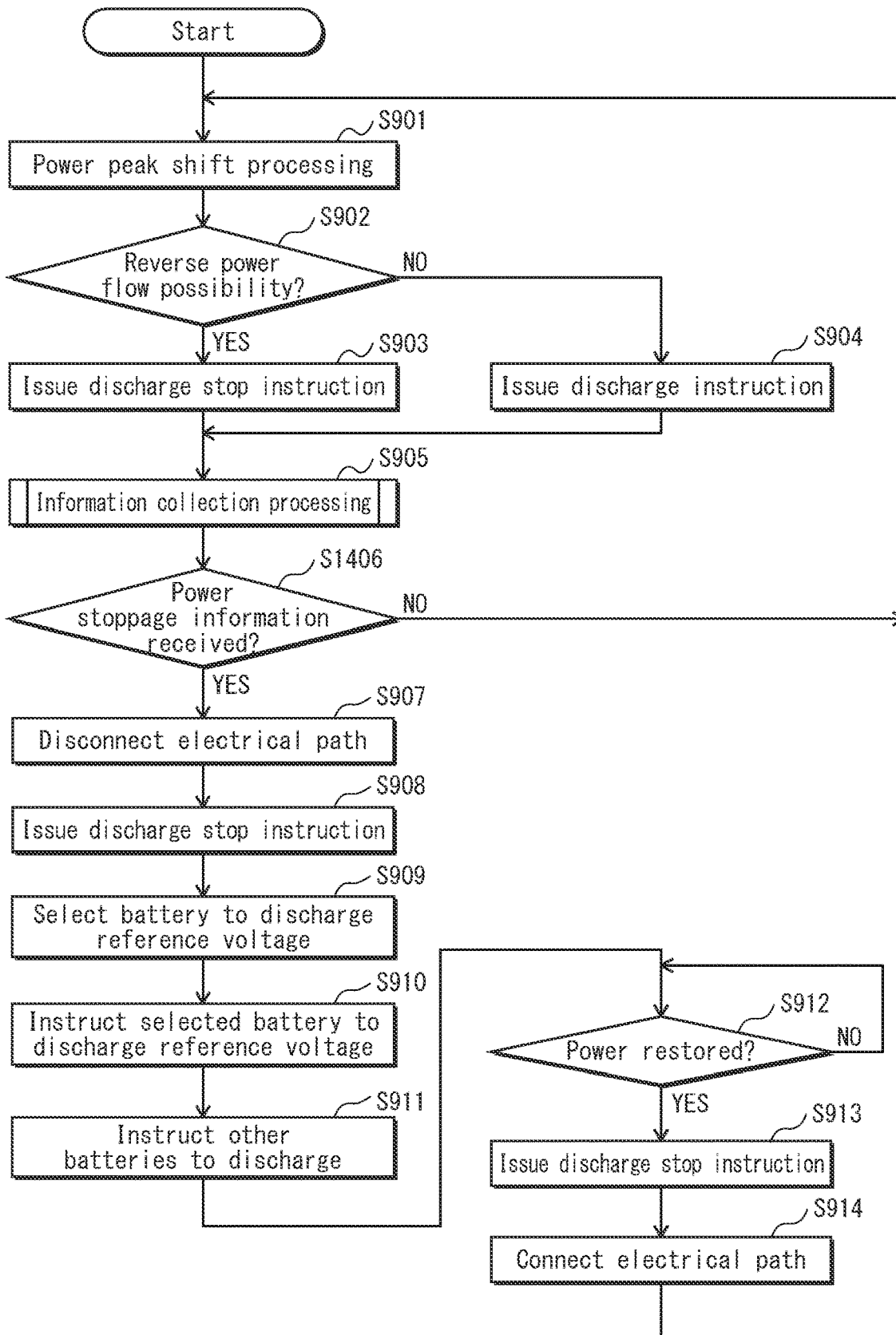
FIG. 14 is a flowchart showing operation of the reverse-power monitoring device 1100 pertaining to embodiment 2.

FIG. 14 is a flowchart showing operations of the reverse-power monitoring device 1100 pertaining to embodiment 2. Description of operations in common with the reverse-power monitoring device 100 pertaining to embodiment 1 is omitted, and only operation unique to embodiment 2 are described here. Thus, in FIG. 14, processing in common with embodiment 1 has the same reference signs as in FIG. 9.

As shown in FIG. 14, operation of the reverse-power monitoring device 1100 differs from embodiment 1 in the processing of step S1406. The controller 1104 detects occurrence of power stoppage by whether or not power stoppage information is received from the communicator 203 (step S1406).

When power stoppage information is received (step S1406), the controller 1204 treats that as a trigger and executes disconnection (step S907), i.e. sets the path switcher 201 to the disconnected state.

Figure 15:
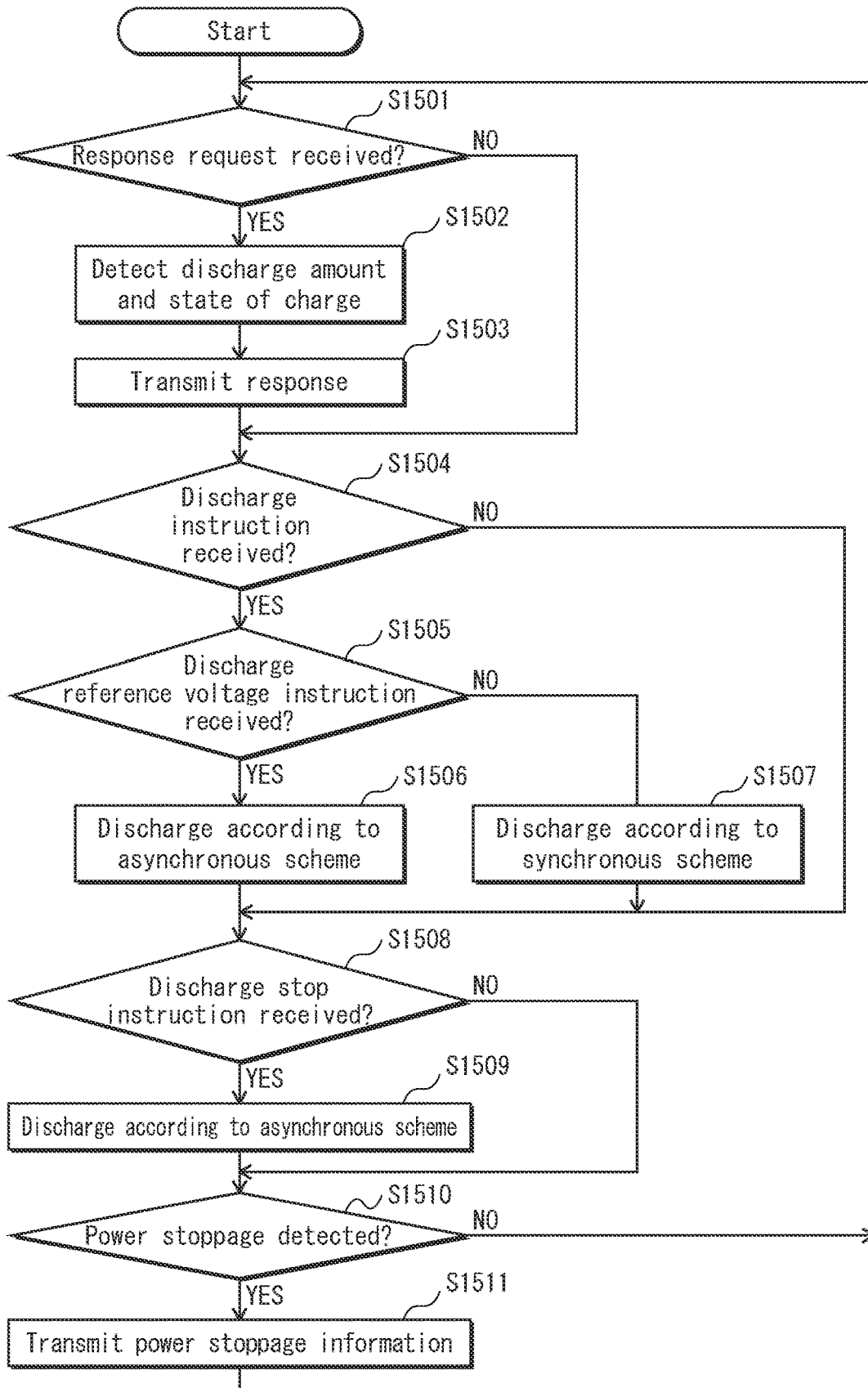
FIG. 15 is a flowchart showing operation of the electricity-storage system 1200 according to embodiment 2.
Figure 16:
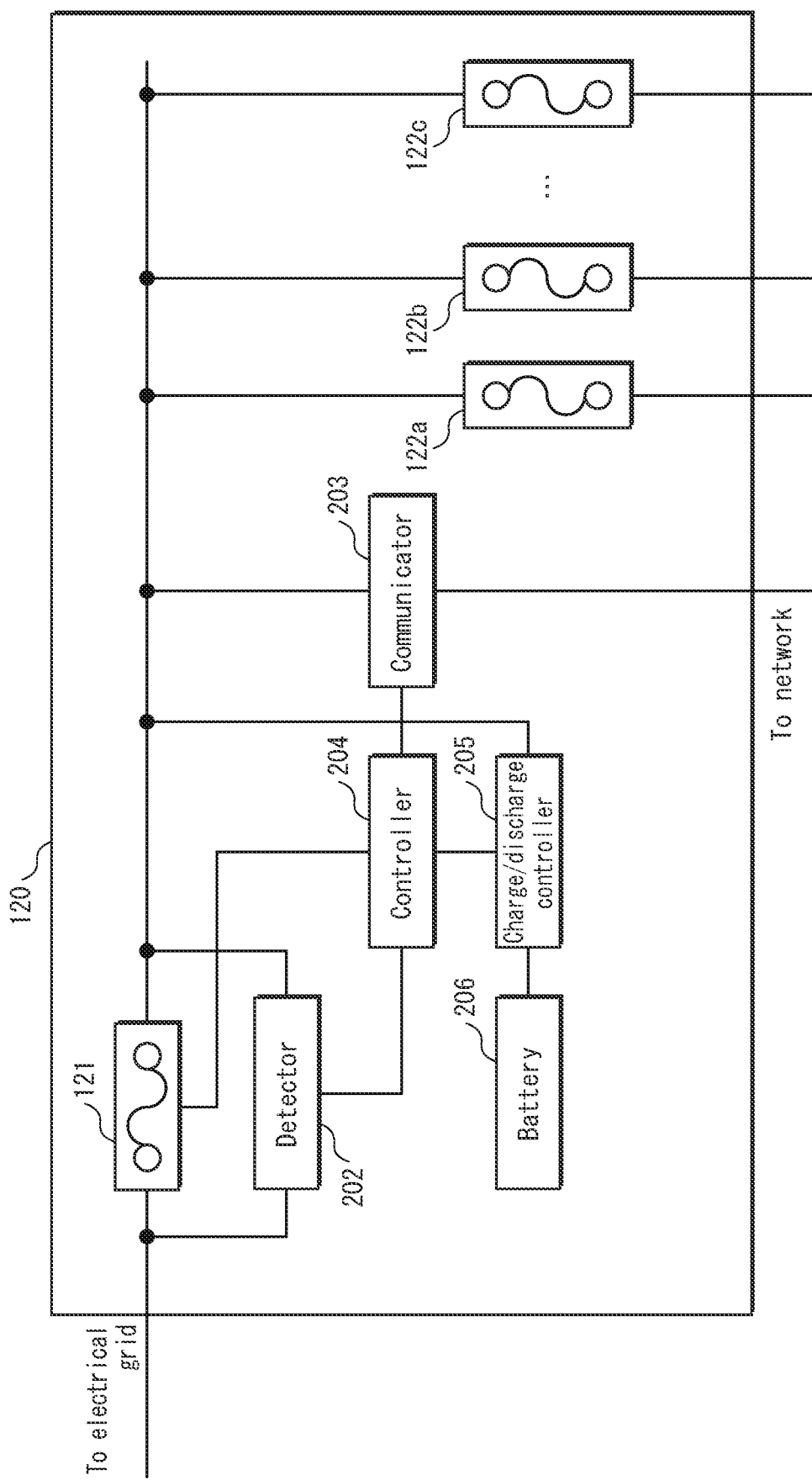
FIG. 16 is a function block diagram showing configuration of functions of a reverse-power monitoring device when incorporated in a distribution board.

FIG. 15 is a flowchart showing operations of the electricity-storage system 1200 pertaining to embodiment 2.

As shown in FIG. 15, when the power stoppage detector of the electricity-storage system 1200 detects power stoppage (YES at step S1510) an indication of the detection is transmitted to the controller 308.

The communicator 1201 receives a signal from the reverse-power monitoring device 1100 via the AC plug 1310 by using PLC.

The controller 1208, in a case in which a signal received from the communicator 1201 is a response request (YES at step S1501), acquires a discharge amount and state of charge of the battery 1207 (step S1502). Subsequently, the controller 1208 causes the communicator 1201 to transmit a response in which the electricity-storage system ID, the discharge amount, and the state of charge of the electricity-storage system are linked (step S1503).

The controller 1208, in a case in which a signal received from the communicator 1201 is a discharge instruction (YES at step S1504), determines whether or not the discharge instruction is a reference voltage discharge instruction (step S1505). The determination is performed based on a flag included in the discharge instruction that indicates whether or not the discharge instruction is a reference voltage discharge instruction.

In a case in which the discharge instruction is a reference voltage discharge instruction (YES at step S1505), the controller 1208 outputs an instruction for asynchronous output to the synchronous/asynchronous unit 1204. Subsequently, the switch 1202 is set to a connected state. In this way, a reference voltage is outputted to the power line network.

In a case in which the discharge instruction is not the reference voltage discharge instruction (NO at step S1505), the controller 1208 outputs an instruction for synchronous output to the synchronous/asynchronous unit 1204. Subsequently, the switch 1202 is set to a connected state. The bi-directional inverter 1205 receives DC power from the battery 1207 and converts it to AC power. The synchronous/asynchronous unit 1204 detects the phase of AC power flowing to the power line network and adjusts the phase of AC power outputted from the bi-directional inverter 1205 to synchronize, i.e. match phase, with power flowing to the power line network, in order to output the AC power to the power line network. In this way, supply of power to the power line network from the electricity-storage systems is performed, power insufficiency can be compensated for, and when a large amount of power is being used a portion of the power supplied from a power company can be reduced.

In a case in which a signal received from the communicator 1201 is a discharge stop instruction (YES at step S1508), the controller 1208 sets the switch 1202 to a disconnected state (step S1509) and processing returns to step S1501.

When the power stoppage detector 1203 detects power stoppage (YES at step S1510), the power stoppage detector 1203 notifies the controller 1208 of the detection.

Thus, the controller 1208, in accordance with the notification, transmits power stoppage information indicating that power stoppage is occurring to the reverse-power monitoring device 1100 via the communicator 1201 (step S1511). According to transmission of the power stoppage information, disconnection is executed and reverse power flow can be prevented.

The above is a description of operation of the electricity-storage system 1200.

<Summary>

According to embodiment 2, detection of power stoppage is performed by the electricity-storage system and, in addition to prevention of reverse power flow during power stoppage, power from the electricity-storage system can be supplied to the power line network during power stoppage.

<Supplement>

The power control system pertaining to the present invention according to the embodiments is described above, but the present invention is not limited to this description. The following describes modifications that are included in the concept of the present invention.

(1) According to an embodiment above, the reverse-power monitoring device 100 includes the path switcher 201 internally. However, as long as the path switcher 201 is inserted into a power line for supplying power to the power line network from the electrical grid, the reverse-power monitoring device 100 may be disposed as an external unit. In such a case, the reverse-power monitoring device 100 includes an interface for outputting instructions pertaining to path switching and sets the path switcher 201 to connect.

(2) According to an embodiment above, the detector 202 detects that there is a possibility of reverse power flow when a total of load capacity of the loads connected to the power line network is not more than a total of discharge amounts of the electricity-storage systems executing discharge. However, other configurations are possible as long as determination of the possibility of reverse power flow can be made.

For example, the detector 202 may determine that there is a possibility of reverse power flow when a total of load capacity is not more than a threshold at least a certain value lower than a total of discharge amounts of the electricity-storage systems executing discharge. According to such a configuration, the possibility of reverse power flow can be reduced by a further margin over the configuration according to embodiment 1, and therefore reliability of detection of reverse power flow can be increased and safety of the system can be increased.

Alternatively, instead of the detector 202 using the electricity-storage system information and the load information, the power line network may be provided with nodes, voltage may be detected at each node and whether or not there is a possibility of reverse power flow may thereby be detected.

Specifically, voltage may be detected at key locations in the power line network (for example, at branch points of the power line network or at terminals downstream of each breaker). A connecting line may be provided from the reverse-power monitoring device directly to each node so that the reverse-power monitoring device detects voltage, or each node may be provided with a voltage detection device and voltage values detected by the voltage detection device may be transmitted to the reverse-power monitoring device.

Thus, an upper limit of voltage is determined for each node, and whether or not there is a possibility of reverse power flow is determined according to whether or not a detected voltage value exceeds the upper limit (or a threshold lower than the upper limit). In a case in which a detected voltage value is determined to exceed a corresponding upper limit, the reverse-power monitoring device determines that reverse power flow is a possibility and causes the electricity-storage systems to stop discharge. At this time, the reverse-power monitoring device may instruct the electricity-storage systems to execute charging. Further, in a case in which the possibility of reverse power flow is low, the reverse-power monitoring device may instruct the electricity-storage systems to discharge.

(3) According to embodiment 2, after the electricity-storage system detects power stoppage, the electricity-storage system waits for instruction from the reverse-power monitoring device to stop discharge, but other configurations are possible and a method of stopping discharge may be configured as follows. When the electricity-storage system has a function of detecting power stoppage as in embodiment 2, the electricity-storage system need not wait for instruction from the reverse-power monitoring device and may stop discharging. In this way, the possibility of reverse power flow can be further decreased.

(4) According to embodiment 2, each of the electricity-storage systems detects power stoppage and notifies the reverse-power monitoring device, but other configurations are possible as long as power stoppage can be detected.

In a case in which the electricity-storage systems are connected to the power line network, any one of the electricity-storage systems may detect power stoppage and notify the reverse-power monitoring device. Further, at such time, the electricity-storage system that detected power stoppage may notify not only the reverse-power monitoring device but also the electricity-storage systems other than the electricity-storage system. Thus, electricity-storage systems that receive the notification may be configured to stop discharge if they are discharging.

(5) According to an embodiment above, the reverse-power monitoring device and the electricity-storage systems communicate according to PLC, but other communication methods (protocols) may be used as long as both the reverse-power monitoring device and the electricity-storage systems can transmit information.

For example, the reverse power monitoring device and the electricity-storage systems may be provided with wireless communicators and information may be transmitted via wireless communication based on a wireless communication standard such as Wi-Fi (registered trademark).

(6) According to an embodiment above, the discharge instruction by the controller 204 during power stoppage is executed after temporarily executing a discharge stop instruction with respect to the electricity-storage systems.

At such time, the controller 204 of the reverse-power monitoring device 100 may cause the detector 202 to detect potentials of the power line network and the controller 204 may instruct discharge after detection that discharge from the electricity-storage systems has stopped.

Further, in power restoration processing, the controller 204 may cause the path switcher 201 to connect after executing a discharge stop instruction and after confirming that discharge from the electricity-storage systems has stopped. Confirmation may be obtained by the electricity-storage systems transmitting discharge stop information indicating that discharge has stopped and may be obtained by causing the detector 202 to detect potentials of the power line network.

(7) According to an embodiments above, although not explicitly specified, the controller 204 may also execute disconnection via the path switcher 201 when the controller 204 determines that there is a possibility of reverse power flow. In such a case, the controller 204 may execute connection via the path switcher 201 when the controller determines that the possibility of reverse power flow is low. In this way, safety of the power control system can be further increased.

(8) According to an embodiment above, although not explicitly specified, responses from the electricity-storage systems and the loads in response to a response request may, for example, be controlled by the reverse-power monitoring device 100 by a response timing specified in the response request in order to avoid interference on the power line network. Further, for example, configuration may be such that even when interference occurs a response arrives at the reverse-power monitoring device by causing responses to be re-transmitted. This can be implemented by, for example, transmitting an acknowledgement signal indicating that a signal is received from a signal reception side for each signal transmitted, and in a case that an acknowledgement signal is not received the signal is re-transmitted.

(9) According an embodiment above, discharge pertaining to power peak processing is executed at a timing at which most power is used in the power line network. However, the reverse-power monitoring device may cause discharge from an appropriate electricity-storage system at other timings to reduce usage of power supplied from a power company.

(10) Although not explicitly described in an embodiment above, the reverse-power monitoring device 100 may further include a home energy management system (HEMS) that controls loads. In other words, the reverse-power monitoring device 100 may include a configuration suppressing possibility of reverse power flow by executing instructions to increase and decrease power consumption by loads.

(11) Although not explicitly described in an embodiment above the electricity-storage systems 110*a*, 110, 1200 may further include a terminal for outputting power, i.e. an electrical outlet. Instead of via a power line network by insertion of a plug of another electrical device into the electrical outlet, the electrical outlet may be configured to directly supply power from the electricity-storage system.

(12) According to an embodiment above, each load transmits load information in response to a response request. However, depending on the load, a case may occur in which the load does not have a function of transmitting load information.

In such a case, a power monitoring device may be provided to an output at a load side to monitor operation of a power conditioner, and a power source disconnection circuit may be provided to handle protection from sudden load fluctuation, etc.

(13) According to an embodiment above, the electrical outlets 140*a*, 140*b*, and the AC plugs 310, 1210 are provided as mechanisms for connecting the electricity-storage systems to the power line network. However, as long as power supply can be received and transmission can be executed, other forms of connector may be used.

(14) According to an embodiment above, the reverse-power monitoring device 100 is configured to detect whether or not a new electricity-storage system is connected to the power line network according to a response from the electricity-storage system. However, as a method of causing the reverse-power monitoring device 100 to recognize a new electricity-storage system, other configurations are possible.

For example, the electricity-storage system may be provided with a button that can be pressed by a user. Thus, upon receiving the press of the button when the electricity-storage system is connected, the controller 204 may cause transmission of information including the electricity-storage system ID, the discharge amount, and the state of charge. The reverse-power monitoring device 100 that receives the information adds the electricity-storage system ID to the electricity-storage system information and updates the electricity-storage system information. According to such a configuration, the reverse-power monitoring device 100 may be caused to recognize existence of a new electricity-storage system.

(15) According to an embodiment above, an example is described in which discharge from the electricity-storage system is executed according to instruction from the reverse-power monitoring device 100, but other configurations are possible. For example, a configuration is possible in which the electricity-storage system requests permission to discharge from the reverse-power monitoring device, the reverse-power monitoring device provides permission in response to the request, and discharge is performed. In such a case, the request to discharge from the electricity-storage system may be outputted at any timing. For example, the electricity-storage system may store a predefined schedule for timing of transmission of the request and perform requests according to the schedule. The schedule may be inputted by a user, and the electricity-storage system may be connected to the network 160, acquire information indicating usage of power in the power line network, and create the schedule according to the information.

(16) Here, alternative configurations to the configurations of the electricity-storage systems indicated in the embodiments above are described.

FIGS. 17 to 20 show alternative configurations of the electricity-storage system 1200 and examples supplied with power directly from photovoltaics (PV), which are power generators, or via a PV power conditioner.

Figure 17:
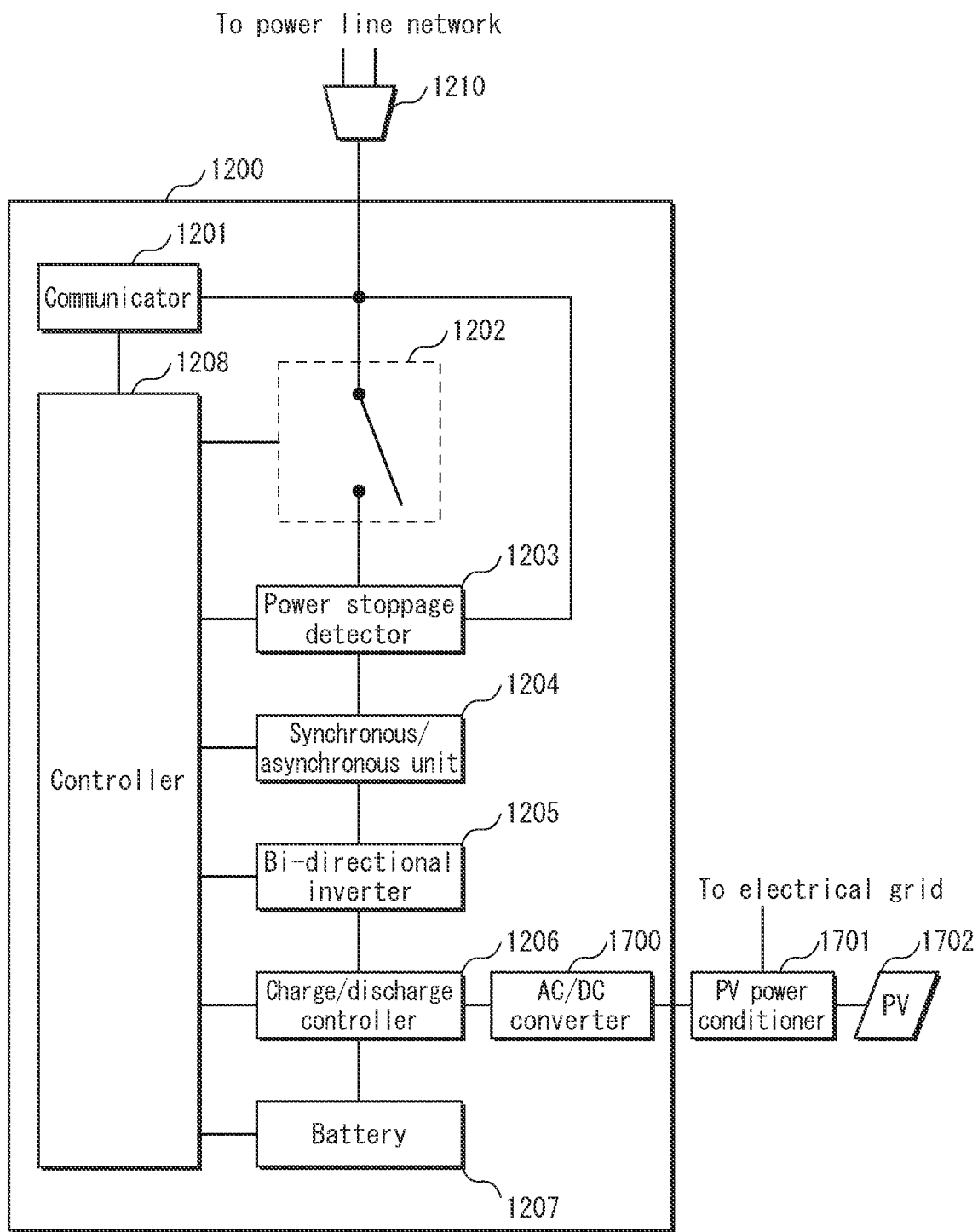
FIG. 17 is a function block diagram showing another configuration example of an electricity-storage system 1200.

FIG. 17 shows a first alternative configuration. As shown in FIG. 17, the electricity-storage system 1200 further includes an AC/DC converter 1700.

As shown in FIG. 17, the AC/DC converter 1700 is connected to a PV power conditioner 1701 and a PV 1702 via the PV power conditioner 1701.

The PV 1702 is a photovoltaic power generator that generates power by receiving sunlight. The PV 1702 is also called a solar power generator. The PV 1702 receives sunlight, generates power, and transmits the generated power to the PV power conditioner 1701.

The PV power conditioner 1701 is a power conditioner for photovoltaic power. The PV power conditioner 1701 has a function of adjusting received power to AC power that the electricity-storage system 1200 can use. The PV power conditioner 1701 outputs AC power after adjustment to the electricity-storage system 1200.

The AC/DC converter 1700 receives supply of AC power adjusted by the PV power conditioner 1701, converts it into DC power, and applies the DC power thus obtained to the charge/discharge controller 1206. Thus, the charge/discharge controller 1206 may be configured to supply the DC power received from the AC/DC converter 1700 to the battery 1207 to execute charging.

Thus, the electricity-storage system 1200 need not rely only on power from the power line network to charge. Even when power supply ceases from one source, power supply can be received from the other source and charging can be executed, and therefore convenience of the electricity-storage system 1200 is increased.

Figure 18:
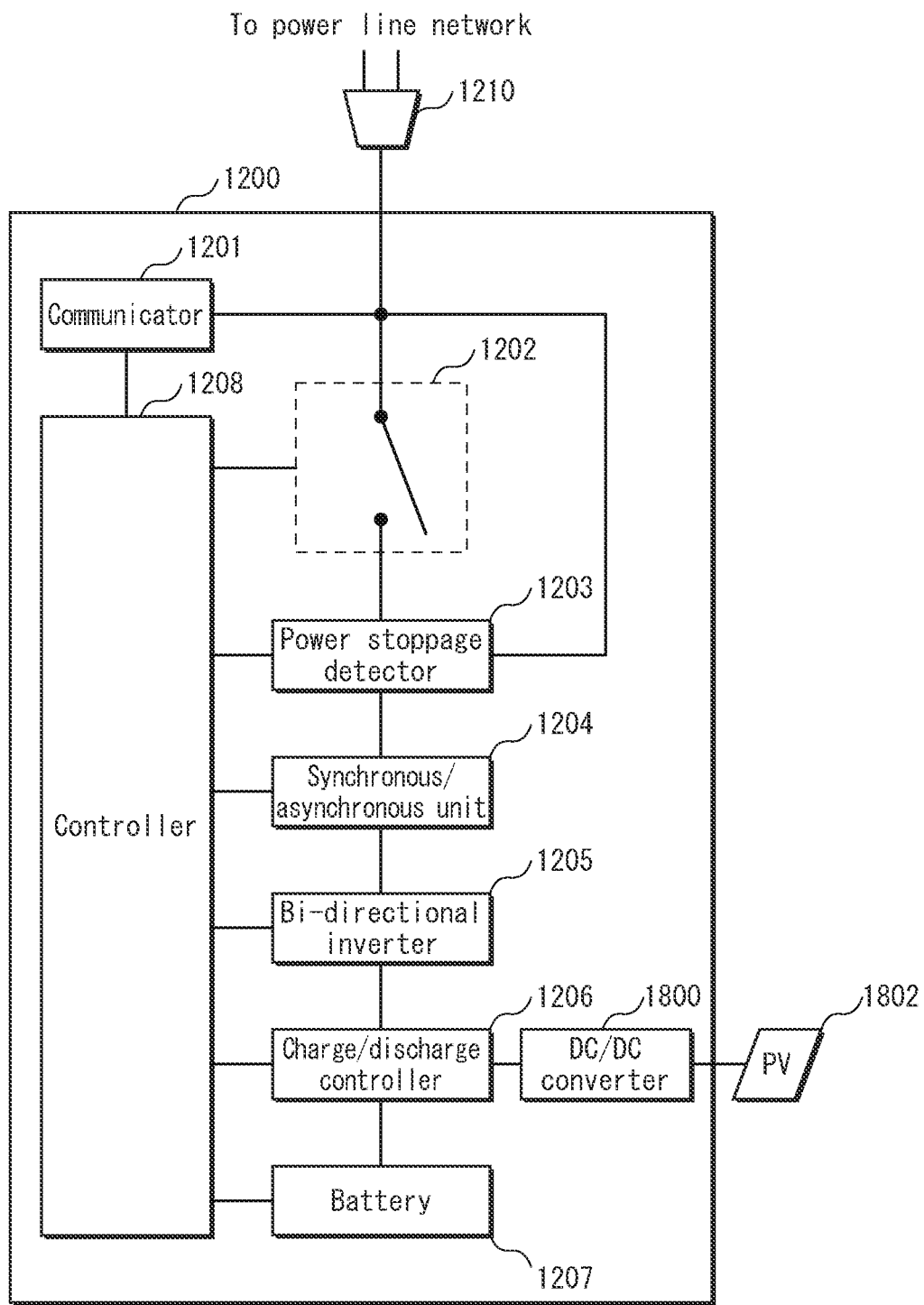
FIG. 18 is a function block diagram showing another configuration example of the electricity-storage system 1200.

Alternatively, the electricity-storage system 1200 indicated in FIG. 17 may be configured as shown in FIG. 18. The electricity-storage system 1200 shown in FIG. 18 is provided with a DC/DC converter 1800 instead of the AC/DC converter 1700.

When configured as shown in FIG. 18, a PV power converter is not required, the DC/DC converter 1800 receives DC power directly from a PV 1802 and converts the received DC power into DC power of a voltage and current that can be used to charge the battery 1207. The DC/DC converter 1800 applies the DC power after conversion to the charge/discharge controller 1206. Thus, the charge/discharge controller 1206 charges the battery 1207 by using the DC power outputted from the DC/DC converter 1800. The DC/DC converter 1800 may be provided with a maximum power point tracking (MPPT) function. MPPT function is a function of calculating a combination of values of current and voltage that can maximize output of the PV 1802.

Figure 19:
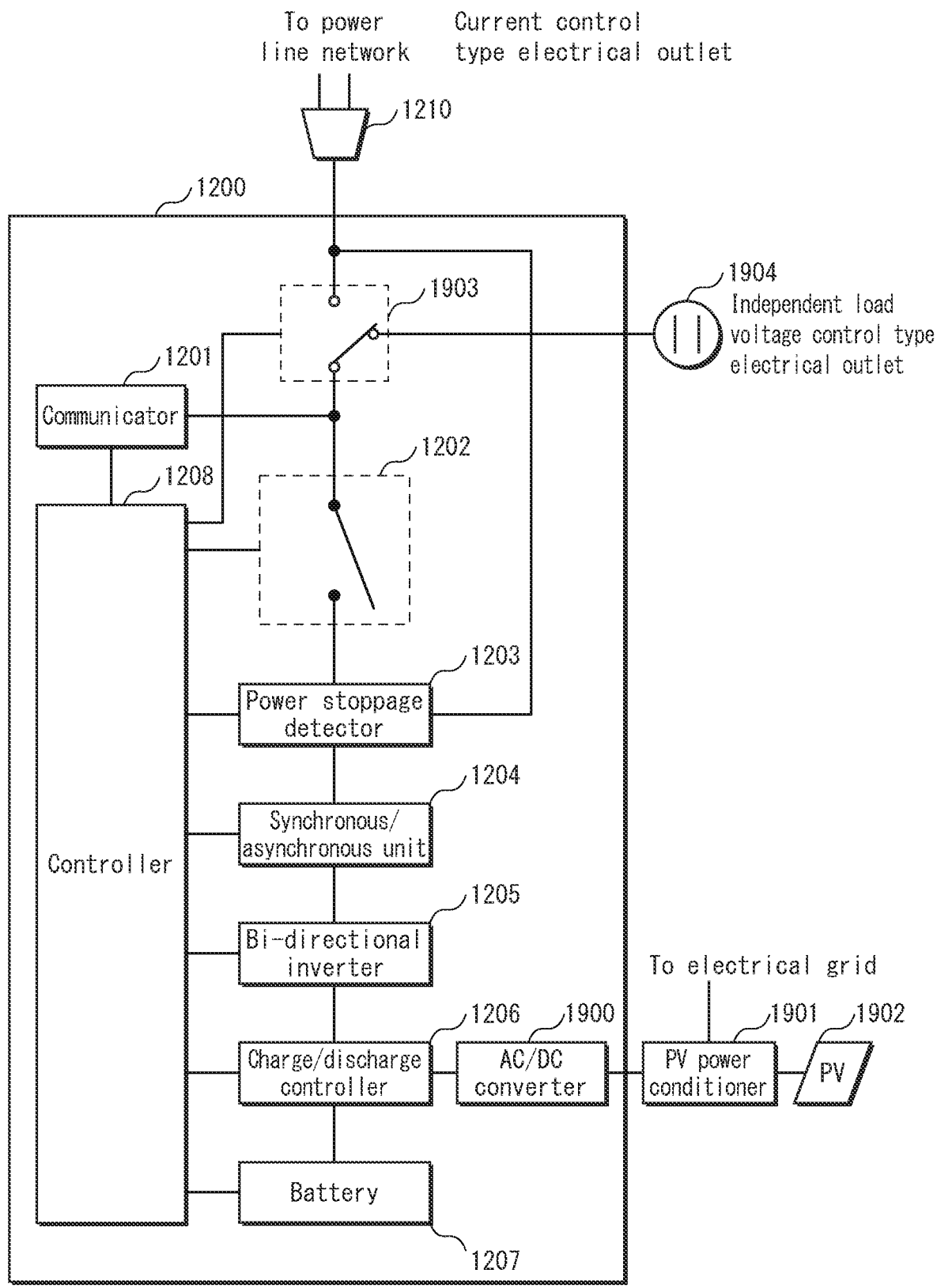
FIG. 19 is a function block diagram showing another configuration example of the electricity-storage system 1200.
Figure 20:
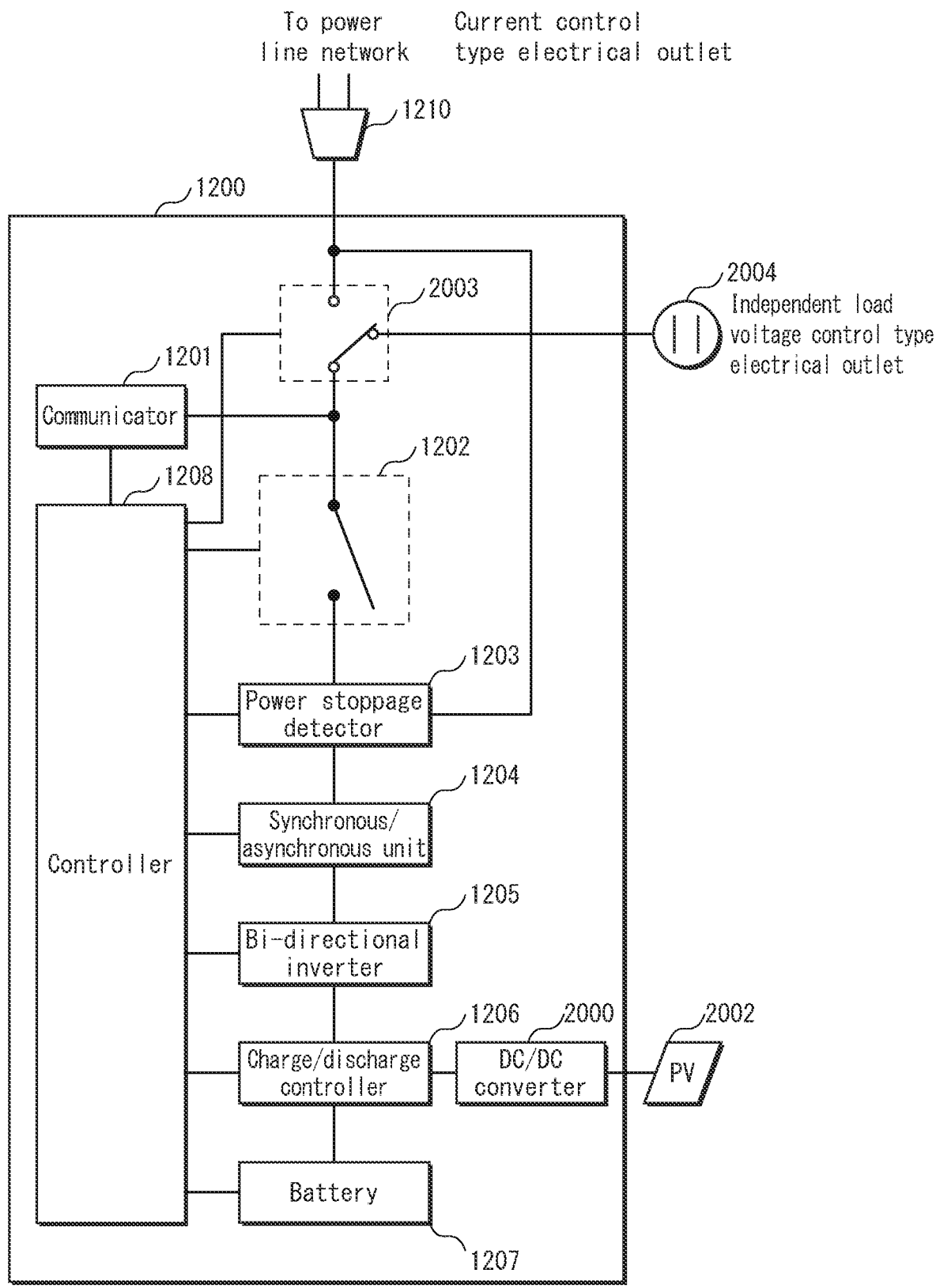
FIG. 20 is a function block diagram showing another configuration example of the electricity-storage system 1200.

Further, the electricity-storage system 1200 shown in FIG. 17 may be configured as the electricity-storage system 1200 shown in FIG. 19 and the electricity-storage system 1200 shown in FIG. 18 may be configured as the electricity-storage system 1200 shown in FIG. 20. An AC/DC converter 1900, a PV power conditioner 1901, and a PV 1902 in FIG. 19 correspond to the AC/DC converter 1700, the PV power conditioner 1701, and the PV 1702 in FIG. 17. Further, a DC/DC converter 2000 and a PV 2002 in FIG. 20 correspond to the DC/DC converter 1800 and the PV 1802 in FIG. 18.

In other words, the electricity-storage system 1200 may be provided with a switch 1903 and an electrical outlet 1904 as shown in FIG. 19, and the electricity-storage system 1200 may be provided with a switch 2003 and an electrical outlet 2004 as shown in FIG. 20.

When provided with such configuration, the electricity-storage system 1200 can supply power to an electrical device directly from the electrical outlet 1904 or the electrical outlet 2004. Further, by providing the switch 1903, 2003, switching between a path from the power line network to the battery 1207 and a path from the electrical outlet 1904, 2004 to the battery 1207 can be performed. According to this configuration that can switch paths, a device connected to the power line network or the electrical outlet can be sufficiently supplied with power. In FIGS. 19 and 20, the electrical outlet 1904, 2004 may be a voltage control type of electrical outlet that controls discharge power. Further, the AC plug 1210 may be a voltage control type that controls discharge power.

By providing an electrical outlet as shown in FIGS. 19 and 20 to the electricity-storage system as an output terminal for alternative power, the electricity-storage system can be used as a portable power supply and convenience of the electricity-storage system is increased.

FIGS. 17 to 20 show PV as an example power generator but the power generator is not limited to PV. Power generation may be performed other than solar power generation, for example the power generator may be a wind power generator or a hydro power generator.

(17) A control program composed of program code for causing a processor or circuits connected to the processor of the electricity-storage system to execute processing (see FIG. 10) of operations pertaining to charging/discharging that are indicated in an embodiment above can be stored on a computer-readable non-transitory medium or may be distributed via communication over various communication channels. Such a non-transitory medium may be an IC card, a hard disk, an optical disk, a flexible disk, ROM, etc. A control program distributed in this way is used by a processor reading the control program stored on a readable memory, etc., and each function shown in the embodiments is implemented by execution of the control program by the processor.

(18) A control program composed of program code for causing a processor or circuits connected to the processor of the reverse-power monitoring device to execute information collection processing (see FIG. 8) of operations pertaining to power control (see FIG. 9) that are indicated in an embodiment above can be stored on a computer-readable non-transitory medium or may be distributed via communication over various communication channels. Such a non-transitory medium may be an IC card, a hard disk, an optical disk, a flexible disk, ROM, etc. A control program distributed in this way is used by a processor reading the control program stored on a readable memory, etc., and each function shown in the embodiments is implemented by execution of the control program by the processor.

(19) Each function unit of the reverse-power monitoring device indicated in an embodiment above may be implemented as a circuit executing the function and may be implemented by a program being executed by at least one processor. Further, the reverse-power monitoring device of an embodiment above may be configured as an integrated circuit (IC), a large scale integration (LSI), or another integrated circuit package. The package may be incorporated into and made available to various devices, and in this way each device can implement each function indicated in an embodiment.

Each function block is typically implemented as an LSI, which is an integrated circuit. A function block, a portion of a function block, or all function blocks may be implemented as one chip. LSI is referred to here, but according to the degree of integration this may be referred to as IC, system LSI, super LSI, or ultra LSI. Further, methods of circuit integration are not limited to LSI and function blocks may be implemented by dedicated circuits or general-purpose processors. After LSI manufacture, a field programmable gate array (FPGA) or reprogrammable processor that can set and reconfigure circuit cells and connections within the LSI may be used.

(20) Each function unit of the electricity-storage system indicated in an embodiment above and each functional element indicated in an embodiment above may be implemented as a circuit executing the function and may be implemented by a program being executed by at least one processor. Further, the electricity-storage system of an embodiment above may be configured as an integrated circuit (IC), a large scale integration (LSI), or another integrated circuit package. The package may be incorporated into and made available to various devices, and in this way each device can implement each function indicated in an embodiment.

Each function block is typically implemented as an LSI, which is an integrated circuit. A function block, a portion of a function block, or all function blocks may be implemented as one chip. LSI is referred to here, but according to the degree of integration this may be referred to as IC, system LSI, super LSI, or ultra LSI. Further, methods of circuit integration are not limited to LSI and function blocks may be implemented by dedicated circuits or general-purpose processors. After LSI manufacture, a field programmable gate array (FPGA) or reprogrammable processor that can set and reconfigure circuit cells and connections within the LSI may be used.

(21) Embodiments 1 and 2 and each modification may be combined as appropriate.

<Supplement>

An embodiment of the electricity-storage system and the reverse-power monitoring device pertaining to the present invention and results thereof are described below.

(a) The electricity-storage system (110a) pertaining to the present invention is an electricity-storage system comprising: a secondary battery (304); a connector (310) that is connectable to a power line network; a communicator (301) that communicates with an external device; and a controller (308) that controls discharge so that, when the communicator receives an instruction indicating discharge enablement, the power line network is supplied power from the secondary battery via the connector.

Here, the power line network is downstream of the external device and indicates a closed electrical grid, for example an electrical grid within building such as a house or factory.

According to this configuration, the electricity storage system performs discharging according to the discharge enablement instruction from the external device and therefore, when compared to an electricity storage system that can freely discharge, the possibility of reverse power flow is reduced, increasing safety when using the electricity storage system. Further, the electricity storage system can be used simply by connecting a plug to an electrical outlet, and therefore has increased convenience for users.

(b) The electricity-storage system pertaining to (a), above, may be configured so that the communicator executes power line communication using the power line network, via the connector.

According to this configuration, the electricity-storage system executes communication by using power line communication via the power line network and the plug (connector) connected to an electrical outlet, and therefore a communication route other than the power line network is not required.

Further, discharge is executed by using communication via the power line network, and therefore discharge is not executed when the plug is not connected to the electrical outlet. In a case in which the electricity-storage system is not connected to the electrical outlet it is not possible to receive instruction, and therefore discharge is not executed. Accordingly, the electricity-storage system has a high level of safety.

(c) The electricity-storage system pertaining to (b), above, may be configured so that the external device is disposed upstream of the power line network and is a monitoring device for monitoring whether or not reverse power flow will occur, the external device has a function of outputting an instruction indicating discharge enablement according to whether or not reverse power flow will occur, and the controller does not cause discharge when the instruction indicating discharge enablement is not received.

According to this configuration, the electricity-storage system does not execute discharge without an instruction indicating discharge enablement from the reverse-power monitoring device that monitors reverse power flow, and therefore can ensure that reverse power flow will not occur.

(d) The electricity-storage system pertaining to (c), above, may be configured so that the controller, when a reference voltage is being applied to the power line network, detects a phase of power flowing to the power line network and selects a synchronous scheme according to which power is synchronized to the detected phase and discharged, and when a reference voltage is not being applied to the power line network, selects an asynchronous scheme according to which a reference voltage is discharged.

According to this configuration, the electricity-storage system can execute discharge both when power from a power company, etc., is already being supplied to the power line network and when power is not already being supplied to the power line network. In a case in which power is already being supplied to the power line network, the electricity-storage system can synchronize to the power and execute discharge, and therefore contribute to the supply of power.

(e) The electricity-storage system pertaining to (d), above, may be configured so that the controller causes discharge according to the asynchronous scheme when the instruction indicating discharge enablement indicates discharge of a reference voltage.

According to this configuration, when the instruction indicating discharge enablement instructs discharge of a reference voltage, the electricity-storage system can execute discharge according to the asynchronous scheme because a reference voltage is not already flowing to the power line network. Synchronous processing can be omitted, and therefore the processing burden of the electricity-storage system can be reduced.

(f) The electricity-storage system pertaining to (a), above, may be configured so that the controller, when the secondary battery is discharging and a discharge stop instruction is received from the external device, causes discharge from the secondary battery to stop.

According to this configuration, the electricity-storage system can stop discharge according to instruction from the external device. Thus, discharge of excessive power need not be performed.

(g) The electricity-storage system pertaining to (a), above, may further comprise a detector that detects whether or not the power line network is in a state of power stoppage; and a power stoppage information transmitter that, when the detector detects that the power line network is in a state of power stoppage, transmits power stoppage information to the external device indicating that power stoppage is occurring.

(h) The electricity-storage system pertaining to (a), above, may further comprise: a power supply terminal that receives supply of power generated by an external power generator; and a charger terminal that charges the secondary battery via the power supply terminal by using the power generated by the external power generator.

Thus, the electricity-storage system can directly receive power from a power generator and therefore during power stoppage the electricity-storage system can contribute as a long-lasting power supply.

(i) The electricity-storage system pertaining to (a), above, may further comprise: an output terminal other than the connector for connecting external equipment in order to supply power from the secondary battery to the external equipment; and a switch that switches between a path for discharging power from the connector to the power line network and a path for discharging power from the connector to the external equipment.

Thus, the electricity-storage system is provided with a power output other than the connecter for connecting to the power line network, and because the electricity-storage system can supply power directly to external equipment without passing through the power line network, the electricity-storage system can be used as a portable battery.

Further, as the electricity-storage system is provided with a path connecting to the external equipment and a path connecting to the power line network, discharge can be executed appropriately. For example, in a case in which both paths intersected it would be possible for discharge to the power line network to make discharge to the external equipment insufficient, but this configuration eliminates this possibility.

(j) The monitoring device pertaining to the present invention is a monitoring device (100) disposed between an electrical grid and a power line network downstream of the electrical grid, the monitoring device comprising: a communicator (203) that, when an electricity-storage system is connected to the power line network via a power supply outlet, executes communication with the electricity-storage system; and a controller (204) that, via the communicator and the power supply outlet, issues instructions to the electricity-storage system pertaining to discharge to the power line network.

According to this configuration, the monitoring device can issue a discharge instruction to the electricity-storage system connected to the power line network. By causing discharge by issuing a discharge instruction, the monitoring device makes discharge control easy and, as a result, the possibility of reverse power flow is reduced.

(k) The monitoring device pertaining to (j), above, may further comprise: a reverse-flow determiner that, when the electricity-storage system is connected to the power line network, determines whether or not there is a possibility of reverse flow occurring, i.e. whether or not there is a possibility of power discharged from the electricity-storage system flowing from the power line network to the electrical grid, wherein the controller, when the reverse-flow determiner determines that there is a possibility of reverse flow occurring, instructs an electricity-storage system that is discharging to stop discharging.

According to this configuration, when there is a possibility of reverse power flow occurring, the monitoring device instructs the electricity-storage system to stop discharging and therefore occurrence of reverse power flow is suppressed.

(l) The monitoring device pertaining to (k), above, may be configured so that the controller is further able to set a physical switch that physically switches the electrical grid and the power line network between a connected state and a disconnected state to the disconnected state when the reverse-flow determiner determines that there is a possibility of reverse flow occurring.

According to this configuration, the monitoring device can physically disconnect the electrical grid from the power line network and thereby reliably prevent reverse power flow in which power flows from the power line network to the electrical grid.

(m) The monitoring device pertaining to (l), above, may further comprise: a power stoppage determiner that determines whether or not the electrical grid is in a power stoppage state, wherein the reverse-flow determiner determines that there is a possibility of reverse flow occurring when the power stoppage determiner determines that the electrical grid is in a power stoppage state.

According to this configuration, the monitoring device can detect power stoppage and thereby prevent reverse power flow. When power stoppage occurs, potential at the electrical grid decreases, making the occurrence of reverse power flow more likely, but this configuration prevents the occurrence of reverse power flow when power stoppage occurs.

(n) The monitoring device pertaining to (m), above, may be configured so that the controller, after instructing discharging to stop when the reverse-flow determiner determines that there is a possibility of reverse flow occurring, instructs the electricity-storage system to discharge power to the power line network.

According to this configuration, the monitoring device can, after power stoppage, instruct the electricity-storage system to discharge, causing power to be supplied to device connected to the power line network during power stoppage.

(o) The monitoring device pertaining to (n), above, may be configured so that at least one electricity-storage system is connected to the power line network, and the monitoring device may further comprise an electricity-storage system information acquirer that acquires information related to a state of charge and a discharge amount of the at least one electricity-storage system connected to the power line network, wherein the controller, when the power stoppage determiner determines that power stoppage is occurring, selects one of the at least one electricity-storage system to cause to discharge, based on the state of charge and the discharge amount of each of the at least one electricity-storage system, and transmits, via the communicator, information for causing the selected one of the at least one electricity-storage system to discharge a reference voltage.

According to this configuration, the monitoring device can instruct a selected electricity-storage system to discharge a reference voltage during power stoppage. Accordingly, when instructing another electricity-storage system to discharge, the monitoring device can instruct the other electricity-storage system to synchronize to the reference voltage and discharge.

(p) The monitoring device pertaining to (k), above, may further comprise: an electricity-storage system information acquirer that acquires information related to a discharge amount of an electricity-storage system connected to the power line network; and a load information acquirer that acquires a power consumption amount of a load connected to the power line network, wherein the reverse-flow determiner determines that there is a possibility of reverse flow occurring when the power amount used by the load connected to the power line network subtracted from the discharge amount of the electricity-storage system is greater than a power value of the electrical grid.

According to this configuration, the monitoring device can detect a possibility of reverse power flow and prevent occurrence of reverse power flow.

(q) The monitoring device pertaining to (k), above, may be configured so that the electricity-storage system is provided in a plurality and the electricity-storage systems are connected to the power line network, and the monitoring device may further comprise an electricity-storage system information acquirer that acquires information related to states of charge and discharge amounts of the electricity-storage systems connected to the power line network, wherein the controller selects an electricity-storage system from the electricity-storage systems based on the states of charge and discharge amounts of the electricity-storage systems and transmits a discharge enablement instruction to the selected electricity-storage system.

According to this configuration, even when a plurality of the electricity-storage systems are connected to the power line network, when a possibility is low of reverse power flow the monitoring device can flexibly cause discharge.

(r) The monitoring device pertaining to (k), above, may be configured so that at least one electricity-storage system is connected to the power line network, and the controller, upon receiving, via the communicator, information from the at least one electricity-storage system indicating that the power line network is in a state of power stoppage, instructs the at least one electricity-storage system to stop discharge.

According to this configuration, the monitoring device can detect power stoppage according to information detected from the electricity-storage system and therefore can reduce a possibility of reverse power flow by instructing discharge to stop in accordance with the information detected.

(s) The monitoring device pertaining to (r), above, may be configured so that the controller, after instructing the at least one electricity-storage system to stop discharge, selects one of the at least one electricity-storage system to cause to discharge, based on the state of charge and the discharge amount of the at least one electricity-storage system, and transmits, via the communicator, information for causing the selected one of the at least one electricity-storage system to discharge a reference voltage.

According to this configuration, the monitoring device can instruct a selected electricity-storage system to discharge a reference voltage during power stoppage. Accordingly, when instructing another electricity-storage system to discharge, the monitoring device can instruct the other electricity-storage system to synchronize to the reference voltage and discharge.

INDUSTRIAL APPLICABILITY

The power control system pertaining to the present invention can be used as a power system with a low possibility of reverse power flow that can be used in emergencies such as power stoppages.

REFERENCE SIGNS LIST 100 reverse-power monitoring device
110a, 110b electricity-storage system
120 distribution panel
121 main breaker
122a, 122b, 122c breaker
130a, 130b load
140a, 140b, electrical outlet
150 electrical grid
160 network
201 path switcher
202 detector
203 communicator
204 controller
205 charge/discharge controller
206 battery
301 communicator
302 ACDC inverter
303 charge controller
304 battery
305 DCAC inverter
306 synchronous/asynchronous unit
307 switch
308 controller
310 plug
1200 electricity-storage system
1201 communicator
1202 switch
1203 power stoppage detector
1204 synchronous/asynchronous unit
1205 bi-directional inverter
1206 charge/discharge controller
1207 battery
1208 controller
1210 plug
1700, 1900 AC/DC converter
1701, 1901 PV power conditioner
1702, 1802, 1902, 2002 PV
1800, 2000 DC/DC converter
1904, 2004 electrical outlet

The invention claimed is:

1. An electricity-storage system comprising:
a first electricity-storage system including a first storage battery, a first communication device, and a first controller that transmits a signal via the first communication device when a power outage occurs; and
a second electricity-storage system including a second storage battery, a second communication device in communication with the first communication device, a DC/AC inverter, and a second controller that stops discharge from the second storage battery to the DC/AC inverter and then to an AC power line network when the second communication device receives the signal from the first communication device, the AC power line network being connected to a load external to the second electricity-storage system,
wherein the first storage battery is configured to supply electrical power to a load external to the first electricity-storage system, and the second storage battery is configured to supply electrical power to the load external to the second electricity-storage system, and a destination of the signal transmitted by the first controller via the first communication device is the second-electricity storage system.

2. An electricity-storage system operating method comprising:

among a plurality of electricity-storage systems that each include a storage battery for supplying electrical power to an external load, and a DC/AC inverter, transmitting from a given electricity-storage system a signal to another electricity-storage system when a power outage occurs; and stopping discharge from the storage battery to the DC/AC inverter and then to an AC power line network of the other electricity-storage system that receives the signal, the AC power line network being connected to a load external to the other electricity-storage system, wherein a destination of the signal transmitted by the given electricity-storage system is the other electricity-storage system.

3. The electricity-storage system of claim 1, wherein the first electricity-storage system further comprises a connector terminal that is electrically connectable to the AC power line network to supply electrical power of the first storage battery to the AC power line network.

4. The electricity-storage system operating method of claim 2, further comprising the given electricity-storage system supplying electrical power from the storage battery thereof to the AC power line network.

5. An electricity-storage system comprising:

a second transmitter that communicates via a first transmitter with a first electricity-storage system including a first storage battery and the first transmitter, the first transmitter transmitting a signal when a power outage occurs;

a second storage battery;

a DC/AC inverter; and a second controller that causes the second storage battery to stop discharge to the DC/AC inverter and then to an AC power line network upon the second transmitter receiving the signal from the first transmitter, the AC power line network being connected to a load external to the electricity-storage system, wherein the first storage battery is configured to supply electrical power to a load external to the first electricity-storage system, and the second storage battery is configured to supply electrical power to the load external to the electricity-storage system, and a destination of the signal transmitted by the first transmitter is the electricity storage system.

6. An electricity-storage system operating method comprising:

among a plurality of electricity-storage systems that each include a storage battery for supplying electrical power to an external load, and a DC/AC inverter, receiving a signal transmitted from a given electricity-storage system when a power outage occurs; and stopping discharge from the storage battery to the DC/AC inverter and then to an AC power line network from the electricity-storage system that receives the signal, the AC power line network being connected to a load external to the other electricity-storage system, wherein a destination of the signal transmitted by the given electricity-storage system is the electricity storage system.

7. The electricity-storage system of claim 5, wherein the first electricity-storage system further comprises a connector terminal that is electrically connectable to the AC power line network to supply electrical power of the first storage battery to the AC power line network.

8. The electricity-storage system operating method of claim 6, further comprising the given electricity-storage system supplying electrical power from the storage battery thereof to the AC power line network.

* * * * *